United States Patent
Jakob et al.

(10) Patent No.: US 6,289,232 B1
(45) Date of Patent: Sep. 11, 2001

(54) COIL ARRAY AUTOCALIBRATION MR IMAGING

(75) Inventors: Peter M. Jakob, Brookline Village; Daniel K. Sodickson, Cambridge; Mark Griswold, Brookline, all of MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 0 days.

(21) Appl. No.: 09/050,404

(22) Filed: Mar. 30, 1998

(51) Int. Cl.[7] .................................................. A61B 5/055

(52) U.S. Cl. ...................... 600/410; 600/422; 324/307; 324/309; 324/318; 324/322

(58) Field of Search ................................ 600/410, 421, 600/422; 324/307, 309, 318, 322

(56) References Cited

U.S. PATENT DOCUMENTS 4,825,162 * 4/1989 Roemer et al. ...................... 324/318

(List continued on next page.)

FOREIGN PATENT DOCUMENTS

WO 99/54746   10/1999  (WO) .

(List continued on next page.)

OTHER PUBLICATIONS

Magnetic Resonance in Medicine 42;952–962 (1999), Klaas P Pruessmann et al "Sense Sensitivity Encoding for Fast MRI".

(List continued on next page.)

*Primary Examiner*—Marvin M. Lateef
*Assistant Examiner*—Eleni Mantis Mercader
(74) *Attorney, Agent, or Firm*—Wolf, Greenfield & Sacks, P.C.; James H. Morris

(57) ABSTRACT

A magnetic resonance (MR) imaging apparatus and technique exploits spatial information inherent in a surface coil array to increase MR image acquisition speed, resolution and/or field of view. Magnetic resonance response signals are acquired simultaneously in the component coils of the array and, using an autocalibration procedure, are formed into two or more signals to fill a corresponding number of lines in the signal measurement data matrix. In a Fourier embodiment, lines of the k-space matrix required for image production are formed using a set of separate, preferably linear combinations of the component coil signals to substitute for spatial modulations normally produced by phase encoding gradients. One or a few additional gradients are applied to acquire autocalibration (ACS) signals extending elsewhere in the data space, and the measured signals are fitted to the ACS signals to develop weights or coefficients for filling additional lines of the matrix from each measurement set. The ACS lines may be taken offset from or in a different orientation than the measured signals, for example, between or across the measured lines. Furthermore, they may be acquired at different positions in k-space, may be performed at times before, during or after the principal imaging sequence, and may be selectively acquired to optimized the fitting for a particular tissue region or feature size. The in vivo fitting procedure is readily automated or implemented in hardware, and produces an enhancement of image speed and/or quality even in highly heterogeneous tissue. A dedicated coil assembly automatically performs the calibration procedure and applies it to measured lines to produce multiple correctly spaced output signals. One application of the internal calibration technique to a subencoding imaging process applies the ACS in the central region of a sparse set of measured signals to quickly form a full FOV low resolution image. The full FOV image is then used to determine coil sensitivity related information and dealias folded images produced from the sparse set.

20 Claims, 22 Drawing Sheets

U.S. PATENT DOCUMENTS

| | | | | |
|---|---|---|---|---|
| 4,857,846 | * | 8/1989 | Carlson | 324/309 |
| 5,208,534 | * | 5/1993 | Okamoto et al. | 324/309 |
| 5,374,890 | * | 12/1994 | Zhou et al. | 324/318 |
| 5,469,060 | * | 11/1995 | Meyerand | 324/309 |
| 5,910,728 | * | 6/1999 | Sodickson | 324/309 |

FOREIGN PATENT DOCUMENTS

| | | | |
|---|---|---|---|
| WO 00/72034 A1 | 11/2000 | (WO) | G01R/33/3415 |
| WO 00/72036 A1 | 11/2000 | (WO) | G01B/33/561 |

OTHER PUBLICATIONS

"Signal–to–Noise Ratio and Signal–to–Noise Efficiency in Smash Imaging", Daniel K. Sodickson, et al., Magnetic Resonance in Medicine 41:1009–1022 (1999).

"Smash Imaging", Daniel K. Sodickson, et al., New Techniques in Body MR Imaging, 1064–9689/99, vol. 7, No. 2, May 1999, pp. 237–254.

* cited by examiner

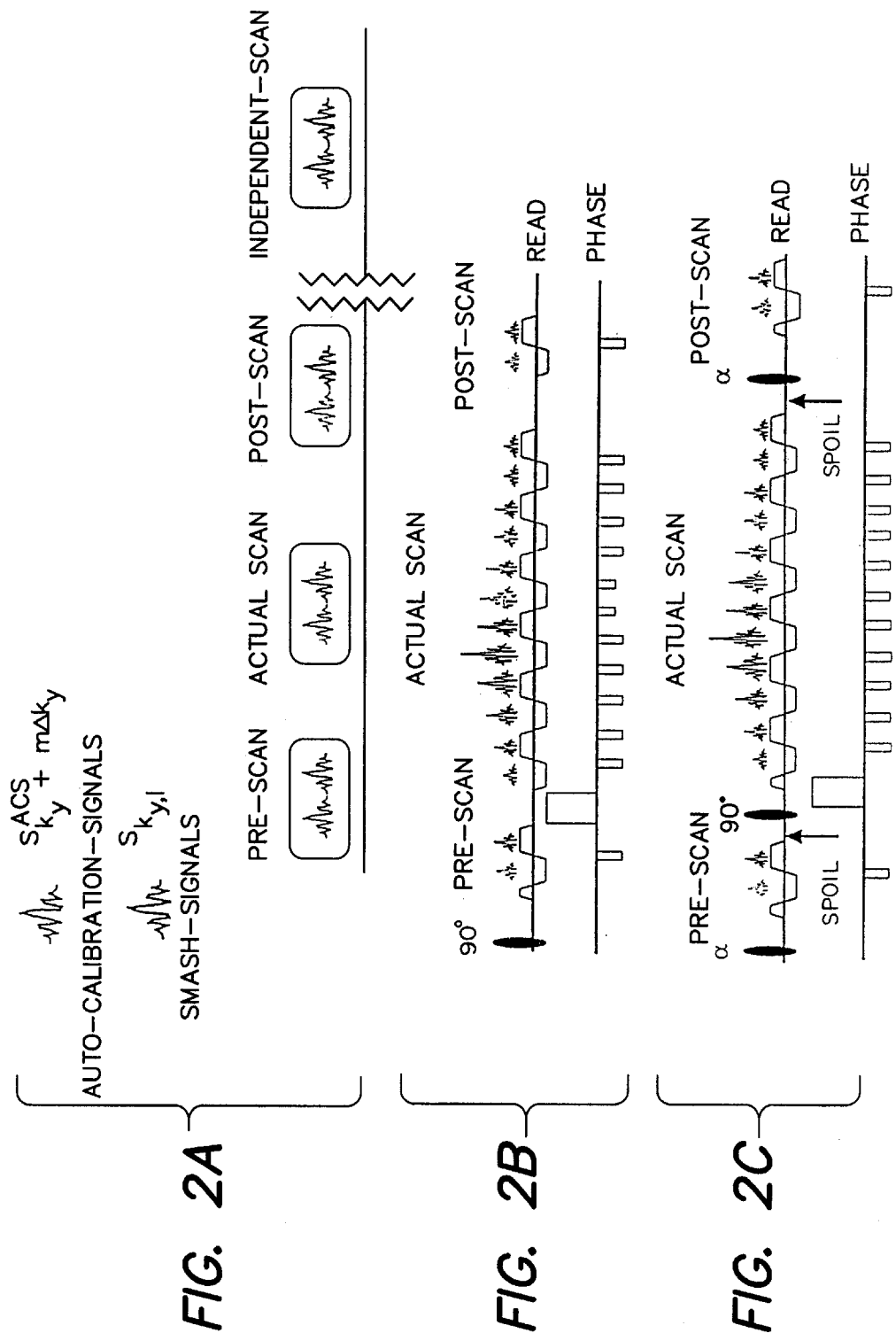

M = 2        M = 3

| | COIL 1 | COIL 2 | COIL 3 | COIL 4 |
|---|---|---|---|---|
| SMASH | 0.270−1.198i | −0.036−1.765i | −0.256+0.408i | −0.293+1.400i |
| AUTO-SMASH (CENTER OF k-SPACE) | 0.124−1.330i | −0.060−1.317i | −0.513+0.451i | −0.227+1.221i |
| AUTO-SMASH (EDGE OF k-SPACE) | −0.471−0.771i | 1.292+0.326i | 1.221−0.079i | 0.154+0.940i |
| INAPPROPRIATE WEIGHTS | 0.328−0.776i | 0.489+0.048i | −0.573−1.328i | −0.129−1.472i |

FIG. 4F

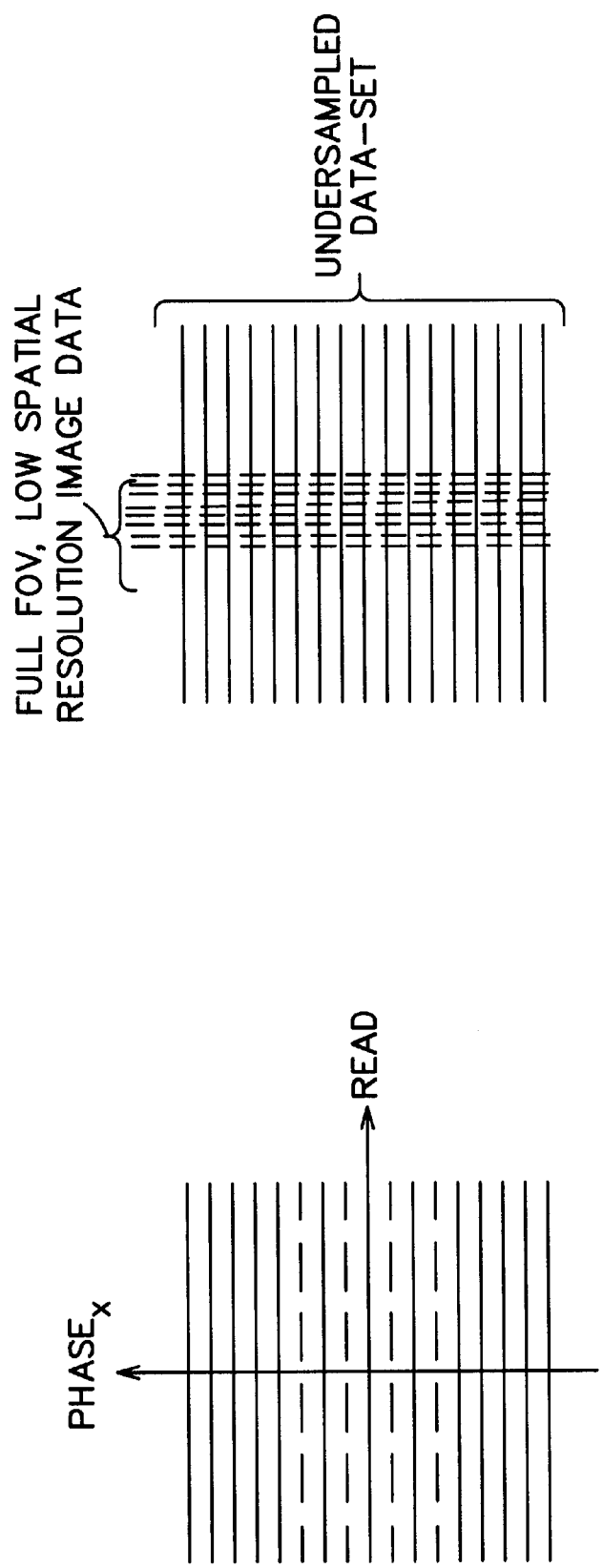

COIL ARRAY AUTOCALIBRATION MR IMAGING

BACKGROUND AND TECHNICAL FIELD

This invention relates generally to magnetic resonance imaging (MRI) using nuclear magnetic resonance (NMR) phenomena. It is particularly directed to a method and corresponding apparatus for more efficiently capturing and providing MR data for use in multi-dimensional imaging processes.

MRI is a widely accepted, medically important and commercially viable technique for obtaining digitized video images representative of internal body tissue and structures. There are many commercially available systems and there have been numerous publications describing their operation and other approaches to MRI. Many of these use multi-dimensional Fourier transformation techniques which are now well-known to those skilled in this art.

In general, MRI devices establish a constant homogeneous magnetic field together with a specific additional bias field gradient in a known plane or region under consideration to orient nuclear spins, and apply a radiofrequency pulse or a sequence of pulses to further condition spins or perturb the nuclei. Those nuclei in a known region of the bias field gradient emit an RF signal in a specific band determined by the magnetic field distribution, and these RF emissions are detected by receiving coils and the received signals are stored as a line of information in a data matrix known as the k-space matrix. The full matrix is built up by successive cycles of conditioning the spins, perturbing them, and collecting RF emissions. An image is then generated from this matrix by Fourier transformation, which converts the frequency information present in the RF oscillations to spatial information representing the distribution of nuclear spins in the tissue.

Magnetic resonance imaging has proven to be a valuable clinical diagnostic tool in a wide range of organ systems and pathophysiologic processes. Both anatomic and functional information can be gleaned from the MR data, and new applications continue to develop with each improvement in basic imaging technique and technology. As technologic advances have improved achievable spatial resolution, for example, increasingly fine anatomic details have been amenable to MR imaging and evaluation. At the same time, fast imaging sequences have reduced imaging times to such an extent that many moving structures can now be visualized without significant motion artifacts.

Often, however, there is a tradeoff between spatial resolution and imaging time, since higher resolution images require a longer acquisition time. This balance between spatial and temporal resolution is particularly important in cardiac MR, where fine details of coronary artery anatomy, for example, must be discerned on the surface of a rapidly beating heart. A high-resolution image acquired over a large fraction of the cardiac cycle will be blurred and distorted by bulk cardiac motion, whereas a very fast image acquired in a shorter time may not have the resolution necessary to trace the course and patency of coronary arteries. Some of the fastest imaging sequences currently implemented, such as echo planar imaging (EPI), approach the goal of yielding images of reasonable resolution in a suitably short fraction of the cardiac cycle. Other approaches have also been tried to eliminate the effects of cardiac motion, including k-space segmentation, in which image acquisition is divided up over several cardiac cycles with ECG gating to ensure that the heart is in the same phase of systole or diastole during acquisition of each segment. Cine images of multiple cardiac phases may be pieced together with this technique, with partial acquisitions of the signal data for different phases occurring in each cardiac cycle. One problem with this class of techniques is that respiratory motion can change the position of the heart over the course of several cardiac cycles. Partial acquisitions will then be misregistered, and artifacts will result. In an attempt to eliminate or adjust for respiratory motion, breath holds, respiratory gating, and navigator echo gating techniques have all been tried, and each of these techniques has had some significant successes. Nevertheless, an imaging strategy which allowed high-resolution images to be acquired comfortably within one or two phases of the cardiac cycle would circumvent many of the difficulties and residual artifacts associated with these compensation techniques.

The speed with which magnetic resonance (MR) images may be acquired has already increased dramatically over the past decade. The improvements in speed may be traced to a combination of advances in the technologies of magnet construction and actuation, and innovations in imaging strategy. Strong, fast-switching magnetic field gradients and fast electronics have allowed the intervals between data collections to be reduced significantly. Meanwhile, fast gradient-echo and spin-echo sequences have reduced image acquisition time by allowing greater portions of k-space to be sampled quickly. Echo planar imaging (EPI), fast low-angle shot (FLASH), turbo spin echo (TSE), and spiral imaging techniques all allow very short intervals between acquisition of successive data points. The DUFIS, OUFIS, RUFIS, and BURST family of sequences further reduce image acquisition time by eliminating time delays incurred during gradient switching and echo formation. Details of the above-mentioned eight techniques may be found in the following papers: P. Mansfield, *Multi-planar image formation using NMR spin echoes. J Phys.* C. 10, L55–58 (1977); A. Haase, J. Frahm, D. Mattaei, W. Hanicke, K. D. Merboldt, *FLASH imaging: rapid NMR imaging using low flip-angle pulses. J. Magn. Reson.* 67, 256–266 (1986); J. L. Listerud, S. Einstein, E. Outwater, H. Y. Kressel, *First principles of fast spin echo. Magn. Reson. Q.* 8, 199–244 (1992); C. Meyer, B. Hu, D. Nishimura, A. Macovski, *Fast spiral coronary artery imaging. Magn. Reson. Med.* 28, 202–213 (1992); I. J. Lowe, R. E. Wysong, *DANTE ultrafast imaging sequence (DUFIS). J Magn. Reson.* Ser. B 101, 106–109 (1993); L. Zha, I. J. Lowe, *Optimized ultra-fast imaging sequence (OUFIS). Magn. Reson. Med* 33, 377–395 (1995); D. P. Madio, I. J. Lowe, *Ultra-fast imaging using low flip angles and FIDs. Magn. Reson. Med* 34, 525–529 (1995); and J. Hennig, M. Hodapp, *Burst imaging. MAGMA* 1, 39–48 (1993).

Increasing the speed of MR imaging further is a challenging proposition, since the aforementioned fast imaging techniques have already achieved an impressive efficiency. All these techniques allow very short intervals between acquisition of successive data points, and hence do not waste much time in accumulating the data to fill the k-space matrix of a size required to generate a given image. In flow-encoded EPI images, for example, the entire complex k-space matrix is filled in a single spin excitation (which is followed by multiple spin conditioning cycles involving the application of multiple stepped field gradients), and the resulting image matrix is likewise "full," with useful information stored in both the real and the imaginary channels. One common feature of nearly all the fast imaging techniques currently in common use, however, is that they acquire data in a sequential fashion. Whether the required data set, i.e., the k-space data matrix, is filled in a rectangular raster pattern, a spiral pattern, a rapid series of line scans, or some other novel order, it is acquired one point and one line at a time.

That is, the above-mentioned fast MR imaging has concentrated on increasing the speed of sequential acquisition by reducing the time intervals between scanned lines. Still, however, only a portion of k-space is acquired at a time, which sets a methodological upper limit to the achievable speed for data acquisition. Modifications to pulse sequences or to magnetic field gradients have yielded a gradual improvement in imaging speed by allowing faster sequential scanning of k-space, but these improvements face limits due to the length and number of the intervals necessary to create, switch or measure the magnetic fields or signals involved in data acquisition. It would therefore appear difficult to devise a purely sequential technique with significantly better efficiency than the current fast imaging techniques.

Parallel acquisitions, in which multiple lines of data are acquired simultaneously, offer a means of relaxing these constraints on imaging speed. A few proposals for parallel or partially parallel acquisition (PPA) of the magnetic response signals in MRI have been described in the literature. These techniques provide some reduction of MR scan time based on spatial encoding with multiple spatially distinct receiver coils. Multiple coil arrays have been used in MR imaging as reported in R. B. Roemer, W. A. Edelstein, C. E. Hayes, S. P. Souza, and O. M. Mueller, *The NMR phased array. Magn. Reson. Med.* 16, 192–225 (1990); C. E. Hayes and P. B. Roemer, *Noise correlations in data simultaneously acquired from multiple surface coil arrays. Magn. Reson. Med* 16, 181–191 (1990); C. E. Hayes N. Hattes, and P. B. Roemer, *Volume imaging with MR phased arrays.* Magn. Reson. Med. 18, 309–319 (1991). The increased information content of the multiple received signals in such systems has been used to increase the signal-to-noise ratio (SNR) of MR images. In PPA imaging, however, each array coil is characterized by a unique spatial response, so that each receiver adds spatial information to the localization process, and this information is used to reduce the number of spatial encoding gradient steps. For their successful operation, all of the PPA techniques rely upon accurate knowledge, or upon estimation, of the relative RF sensitivities of the component coils in the array used for imaging.

Among the PPA imaging schemes proposed to date using simultaneous data acquisition in multiple RF receiving coils, are those described in: J. W. Carlson, T. Minemura, *Imaging time reduction through multiple receiver coil data acquisition and image reconstruction. Magn Reson Med* 29, 681–688 (1993) and U.S. Pat. No. 4,857,846; J. B. Ra, C. Y. Rim, *Fast imaging using subencoding data sets from multiple detectors. Magn Reson Med* 30, 142–145 (1993); and Sodickson D. K., Manning W. J. *Simultaneous Acquisition of Spatial Harmonics (SMASH): Fast Imaging with Radiofrequency Coil Arrays. Magn. Reson. Med* 38: 591–603 (1997); Sodickson D. K., Bankson J. A., Griswold, M. A., Wright S. M. *Eightfold improvements in MR Imaging speed using SMASH with a multiplexed eight-element array. Proc. Sixth Scientific Meeting of the International Society for Magnetic Resonance in Medicine,* 577 (1998). These approaches have offered the promise of significant savings in image acquisition times.

Carlson and Minemura describe a two-fold acquisition time savings using two nested body coils. In their approach, partial data sets are collected simultaneously in the two coils, one of homogeneous sensitivity and the other with a linear gradient in sensitivity. Missing lines in k-space are generated using a series expansion in terms of other phase-encoded lines. This approach using body coils appears to require that a significant portion of the data for the partial k-space matrix be acquired before any of the missing lines can be filled in by postprocessing, and thus does not allow for the missing lines to be built up as the data arrives, in real time. The approach uses coil sensitivity information in place of some portion of the gradient phase encoding steps, but has drawbacks. The coils used by Carlson and Minemura are body coils, which provide large volume coverage but lower overall sensitivity than surface coils, and it would be difficult to augment their number to improve time savings.

The approach of Ra and Rim involves a simultaneous acquisition technique in which images of reduced FOV are acquired in multiple coils of an array and the Nyquist aliasing in those images is undone by reference to component coil sensitivity information. The unaliasing procedure involves a pixel-by-pixel matrix inversion to regenerate the full FOV from multiple copies of the aliased image data. The "subencoding" technique of Ra and Rim relies on estimates of component coil sensitivities by effectively probing the sensitivity at each pixel. This pixel-by-pixel approach can lead to local artifacts; for example, the matrix inversion can begin to fail in regions of low sensitivity. Further, by its very nature as a pixel by pixel dealiasing approach, the Ra & Rim method is computation-intensive and is limited to postprocessing, as it appears to require all image data to be present before the reconstruction can be undertaken.

The Sodickson et al technique, denoted by the acronym SMASH, which stands for SiMultaneous Acquisition of Spatial Harmonics was initially developed by one of the applicants herein, and is more fully described in U.S. patent application Ser. No. 08/446,358 filed Nov. 12, 1996, and in the above-referenced two Sodickson D. K., et al. papers; in Sodickson, D. K., Griswold M. A., Jakob P. M., Edelman R. R., Manning, W. J. *Signal-to-noise* ratio and signal-to-noise efficiency in SMASH Imaging. Proc. Sixth Scientific Meeting of the International Society for Magnetic Resonance in Medicine, 1957 (1998); and in further Abstracts by the same authors. The SMASH technique is a PPA technique which extracts additional spatial information from a collection of signals acquired simultaneously in multiple coils that have different sensitivities, by combining acquired signals with weights to synthesize multiple distinct signals each corresponding to a sinusoidal spatial variation in coil sensitivity. These spatial variations, or "spatial harmonics," take the place of spatial modulations normally produced by magnetic field gradients in a conventional MR imaging protocol, and the simultaneous acquisition of signals to form multiple spatial harmonics in the signal domain thus allows the simultaneous acquisition of multiple lines of MR data. The SMASH technique can be integrated with many of the fastest existing imaging sequences, yielding multiplicative improvements in imaging speed, and a factor of two to three time savings has already been demonstrated in vivo using SMASH with commercially available coil arrays, with up to eight-fold improvements reported in phantoms using specialized RF hardware. In principle, there is no limit to the number of k-space lines that may be scanned simultaneously, assuming that coil arrays with sufficient numbers of independent coil components having suitable sensitivities are available for a given field-of-view (FOV).

Although PPA imaging techniques based on coil arrays can provide a considerable improvement in imaging speed, the common constraint of the PPA imaging techniques is their dependence on the accurate measurement or knowledge of component coil sensitivities or sensitivity-related information. The PPA reconstructions rely upon an accurate estimate of the individual coil sensitivity functions in the underlying coil array. A number of strategies for coil sensitivity calibration have been proposed. Ra J. B., et al. *Magn. Reson. Med* 30: 142–145 (1993); Sodickson D. K., et al. *Magn. Reson. Med.* 38: 591–603 (1997); Axel L., et al. *AJR* 148: 418–420 (1987); Murakami J. W., et al. *Magn. Reson. Med.* 35: 585–590 (1996). These strategies basically fall into four groups.

First, the coil sensitivity profiles can be calculated from the Biot-Savart law using knowledge of the coil's size, shape and position relative to the slice-of-interest (SOI). However, this approach is generally impractical in vivo, since the theoretical field map may correlate poorly with the actual sensitivity profiles because of unpredictable variations in coil loading effects and inaccurate coil positioning.

Second, the sensitivity information can be obtained from images of a uniform phantom (i.e., a test object) taken at the same position as the in vivo images. However, the use of an in vitro reference can be problematic in many cases, since coil loading and/or coil position may change significantly from subject to subject, thereby changing the effective coil sensitivities existing in practice. In addition, acquiring and using these reference data to correct subsequent in vivo images can be impractical with arrays such as flexible phased arrays, since the exact locations of the individual coils may be affected by the subject's anatomy.

Third, an estimate of the coil sensitivity functions can be obtained by acquiring the required coil references in vivo in the desired image plane. This method was used for the first in vivo implementations of SMASH. However, this approach requires that a reference image set be acquired using an appropriate imaging technique, which we term "coil sensitivity weighted", before the postprocessing of the PPA images is possible. This procedure can be imperfect, since it requires first identifying a region of uniform spin density against which to calibrate the sensitivities. This requirement is often impossible to fulfill in vivo, especially in regions of highly varying spin density such as in the chest, which has regions of very low signal-to-noise in the area of the lungs, and regions of very high signal to noise in the area of the heart. In addition, $B_0$ and $B_1$ magnetic field inhomogeneities may distort the true coil sensitivity profiles, depending on the imaging technique used. Furthermore this procedure can also be time consuming, since it has to be performed for each SOI.

A fourth technique which avoids some of the problems mentioned above, is to derive an estimate of the sensitivity profiles from a combination of body coil and array coil images of the subject as reported by Murakami et al for phased array coils. In this approach, the surface coil image is divided by the body coil image to derive the array coil sensitivity profile. This approach accurately estimates the coil sensitivity functions in areas where sufficient signal-to-noise ratio is available for the quotient to be meaningful. However this condition may fail to hold in areas such as the lungs. This method also increases scan time significantly, since the data has to be acquired in additional independent scans. In addition, this approach is difficult to apply in moving tissue structures, since the body coil and phased array coil image have to be obtained ideally in exactly the same position. Therefore, in the situation of involuntary subject motion, breathing and cardiac motion, the accuracy of this coil sensitivity calibration can be impaired or entirely defeated. Ra and Rim have described a similar method using a reference array image set without the body coil image, but in other respects it suffers from the same difficulties.

In summary, PPA techniques, including SMASH, rely upon accurate estimation of the sensitivity functions of individual coils in a coil array. Estimation can be a cumbersome, inaccurate and time-consuming procedure which in the worst case may eliminate the time savings which PPA techniques promise. The problems posed by the need to determine coil sensitivities limits potential applications of faster imaging with PPA.

It is therefore desirable to develop improved methods and devices for determining relevant parameters for image reconstruction without cumbersome determinations of exact receiving coil sensitivity.

It is also desirable to provide a method and apparatus for determining such parameters or information from in vivo signals, and from such signals acquired with little or no additional spin conditioning.

In order to address these limitations, applicants have developed a new internal calibration technique for SMASH imaging, called AUTO-SMASH, in which sensitivity-related reconstruction parameters are determined from signals aquired (e.g., during the actual scan) by an auto-calibration mechanism that relies on fitting sets of collected signals. Details of both acquisition and reconstruction strategies in this new AUTO-SMASH approach are provided below, together with a description of aspects of the invention relating to extraction of calibration information for SMASH and other PPA imaging techniques.

SUMMARY OF THE INVENTION

These and other desirable ends are achieved in accordance with the present invention by acquiring calibration information from an in vivo MR signal collection acquired during the application of different gradients of known spacing and orientation. In one embodiment of the invention, this process determines coefficients by fitting measured signals to an autocalibration signal acquired with a gradient of different offset or orientation. This calibration procedure defines the coefficients of a transformation, which may be applied directly to collected signals to fill a spatial data matrix using a smaller set of measured signal data acquired using a reduced set of conditioning or data acquisition steps. The data matrix is then transformed to yield an accelerated MR image of increased resolution or decreased acquisition time. In another embodiment, a reduced set of lines is acquired corresponding to an aliased image, and an additional set of central data lines are acquired to form a low resolution image. A de-aliasing transform is then formed using the low resolution image.

In an illustrative embodiment using gradient steps to form a k-space data matrix, the apparatus operates by performing a spatial encoding spin conditioning step and collecting MR signals in a plurality of coils. It also performs at least one additional and shifted or differently oriented spatial conditioning step to collect one or more autocalibration (ACS) signals. The processor determines a transformation of the collected MR signals to the ACS signals, and a sparse set of data lines is acquired to fill a subset of the data array needed for an image. The transformation is then applied to the sparse set of data lines to fill intervening lines of the data array, thus producing a full-field of view, full resolution signal data set in reduced time. When used with a PPA imaging technique that transforms multiple coil signals into aliased or partially encoded images which must be reconstructed using coil sensitivity data, the apparatus may operate by collecting measurement signals and ACS signals to quickly acquire a set of lines of data near the center of k-space, and form a de-aliasing or other reconstruction transform from the low resolution data.

In a typical practice of the invention, a fitting transformation for the acquired ACS signals is applied to the magnetic resonance response signals received simultaneously in the several coils to convert them into additional lines in the signal data set. In further aspects of the invention, the ACS signals may be acquired in a spatially selective and/or temporally selective way to improve the fit of the transformation for imaging a particular region, to compensate for evolving signal during acquisition, or to avoid anomalous regions of the imaged subject. The ACS lines themselves may be used directly in the image data signal set, and may substitute for or augment standard data lines. The ACS lines are quickly acquired before, during or after the imaging sequence. Further, plural ACS signal lines may be acquired at different times interspersed during the signal collection to provide a fit at each region of k-space, or to correct for magnetization decay during the imaging sequence being used. The autocalibration may also be applied to gradient, RF or other spin conditioning steps corresponding to non-Fourier imaging. When used in subencoding PPA magnetic resonance imaging, the method provides a pixel by pixel matrix inversion to de-alias the image set.

BRIEF DESCRIPTION OF THE DRAWINGS

These and other features of the invention will be understood from the description herein of representative methods and apparatus of the present invention, read in light of the prior art and taken together with the drawings herein illustrating representative embodiments and features of the invention, wherein

FIGS. 2A–2C show autocalibration signal acquisitions in accordance with the invention;

FIGS. 8A–8E illustrate subencoding embodiments of the invention;

DETAILED DESCRIPTION

Figure 1:
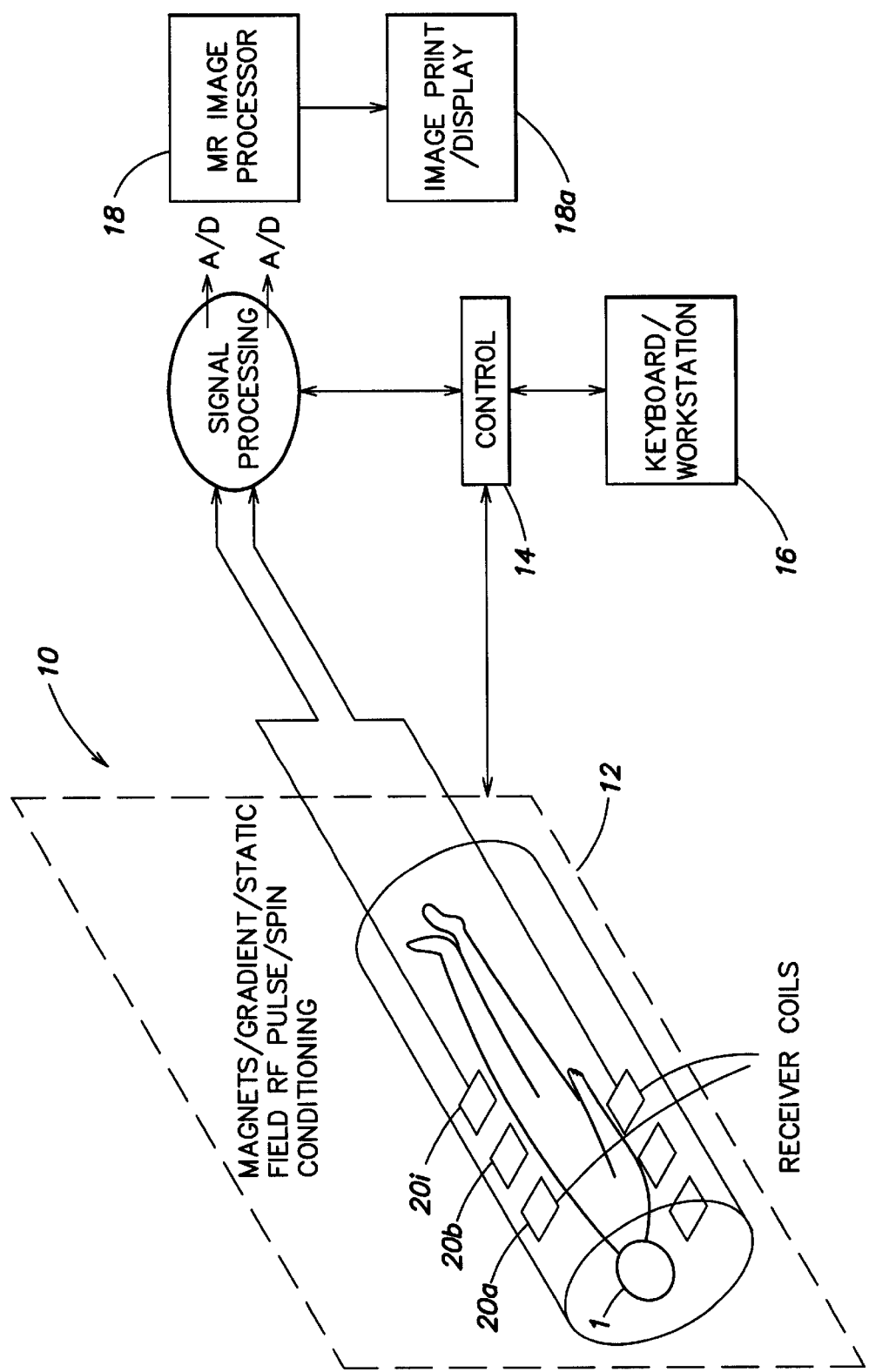
FIG. 1 illustrates a magnetic resonance imaging apparatus of the present invention.

FIG. 1 illustrates schematically an MRI system 10 which includes the usual static magnet assembly, gradient coils, and transmit RF coils, collectively denoted 12, under control of a processor 14, which typically communicates with an operator via a conventional keyboard/control workstation 16. These devices generally employ a system of multiple processors for carrying out specialized timing and other functions in the MRI system 10 as will be appreciated. Accordingly, as depicted in FIG. 1, an MRI image processor 18 receives digitized data representing magnetic resonance responses from an object region under examination (e.g., a human body 1) and, typically via multiple Fourier transformation processes well-known in the art, calculates a digitized visual image (e.g., a two-dimensional array of picture elements or pixels, each of which may have different gradations of gray values or color values, or the like) which is then conventionally displayed, or printed out, on a display 18a. In many aspects of such overall operation, the apparatus of the present invention is largely conventional, and indeed will be illustrated in applications to two distinct prior art imaging operations below. However, in accordance with the present invention the basic MR response signal acquisition is modified, and subsequent signal processing altered with calibration information to supplement partial response signal data collected in a plurality of coils $20a, 20b \ldots 20i$ used, along with corresponding signal processing and digitizing channels, for simultaneous signal reception.

The invention is best understood in the context of the SMASH imaging technique mentioned above, which sets out to compute, from a given set of magnetic response signals received in a set of coils during one spatial encoding step, a plurality of synthesized signals which correspond to additional spatial encoding steps. While SMASH imaging is applicable to non-Fourier as well as Fourier imaging techniques, the formalism and terminology for Fourier imaging is commonly accepted and well understood, so the description of the present invention will be presented below as applied to the evaluation of coil sensitivities in a SMASH imaging process wherein the MRI processor fits coil sensitivities to produce spatial harmonic signals to fill additional lines in k-space, so that a sparse or reduced set of gradient conditioning steps may be used while still filling the entire data set. In what follows, it is shown that the set of optimal complex weights $n_l^{(m)}$, necessary for SMASH postprocessing to determine distinctly offset signal lines can be determined using auto-calibration signals (ACS) which are acquired with a small number of additional conditioning or gradient steps, and serve as a form of navigator measurement. The ACS lines represent signals at intermediate positions in k-space, which are spatially encoded in a conventional manner using gradients. Moreover, the set of linear weights, $n_l^{(m)}$ may be extracted automatically for each acquisition without the intermediate step of coil sensitivity measurements. These coefficients form a transformation which, applied to signals collected in one gradient step, produces multiple distinctly shifted lines of k-space. The transformation thus fills many lines of k-space from a reduced set of gradients.

In non-Fourier embodiments, the spatial encoding steps are performed to encode non-Fourier basis functions, and the transformation forms combinations of component coil signals, carried out to fill additional lines of the non-Fourier data space. The relevant ACS then represent additional non-Fourier basis functions used to calibrate this transformation.

The relationship between the coil sensitivities and the calculations on collected signals will be understood from the following description, including a brief review of the SMASH technique. A further discussion and description of features and results of that technique are found in the aforesaid patent application of D. Sodickson and papers of Sodickson et al, supra, all of which are hereby incorporated herein by reference, and to which reference is made for further details of construction, implementation and other applications.

The SMASH procedure operates by forming combinations in signal space, of the signals simultaneously acquired in multiple surface coils that have different spatial sensitivities. These combinations are used to reconstruct or synthesize a set of signals which would have been acquired with a different phase encoding step. Intuitively, they may be said to replace "missing" signals in a data set which has been acquired with a smaller or reduced set of phase encoding operations. In other words, the linear combination of component coil signals substitutes for spatial modulations normally produced by phase encoding gradients, allowing postprocessing or purely computational steps to replace a substantial portion of the normally required hardware operations. The reduced set of spatial encoding, or the corresponding partial data set or k-space matrix shall generally be referred to below as "sparse", "reduced" or "small". In the proof-of-principal example discussed below, these correspond, for example, to performing every other, or every third, gradient or spin conditioning step, and to collecting a similar sub-lattice of the k-space lines as measurement signals.

In the original descriptions of SMASH imaging, it was noted that the determination of coil sensitivities determines a transformation of L simultaneously acquired but distinct coil signals into a number M of distinct offset k-space signal entries. As will be seen below, the present invention instead fits a set of the simultaneously acquired signals to another set of signals (denoted ACS or autocalibration signals) acquired with a known but different applied gradient, to develop an equivalent set of coefficients, without the need to determine absolute coil sensitivities. The transformation on response signal data is highly accurate even for regions of heterogeneous signal. The derivation and equivalence will now be described in the context of SMASH spatial harmonic representations.

In a coil array with L components, each coil l has a distinct sensitivity function $C_l(x, y)$. In SMASH imaging, for a standard imaging situation, the component coil signals are combined so as to produce a composite sensitivity $C_o^{comp}$ which extends across the region of interest:

$$C_0^{comp}(x, y) = \sum_{l=1}^{L} n_l^{(0)} C_l(x, y) \quad [1]$$

The coil weights $n_l^{(0)}$ may be chosen to produce uniform image intensity. For such combinations, the composite MR signal for a plane with spin density $\rho(x, y)$ takes the form, $$S^{comp}(k_x, k_y) = \sum_{l=1}^{L} n_l^{(0)} S_l(k_x, k_y) \quad [2]$$

$$= \int\int dx dy \sum_{l=1}^{L} n_0^l C_l(x, y)\rho(x, y)\exp\{-ik_x x - ik_y y\}$$

$$= \int\int dx dy C_0^{comp}(x, y)\rho(x, y)\exp\{-ik_x x - ik_y y\}$$

where $k_x \equiv \gamma G_x t_x$ and $k_y \equiv \gamma G_y t_y$ as usual, with $G_x$ and $G_y$ the magnitude of the x and y gradients, and $t_x$ and $t_y$ the times spent in the x and y gradients, respectively. Inverse Fourier transformation of Eq. [2] with respect to $k_x$ and $k_y$ reconstructs the usual spin density function $\rho(x, y)$ multiplied by the composite sensitivity profile $C_o^{comp}$.

In the SMASH approach, signals from the various array components are combined with different linear weights, $n_l^{(m)}$, to produce sinusoidal spatial sensitivity profiles (spatial harmonics of order m) on top of the original profile $C_o^{comp}$:

$$C_m^{comp}(x, y) = \sum_{l=1}^{L} n_l^m C_l(x, y) = \quad [3]$$

$$C_0^{comp}\{\cos(m\Delta k_y y) + i\sin(m\Delta k_y y)\} = C_0^{comp} \exp(im\Delta k_y y)$$

Here m is an integer, and $\Delta k_y = 2\pi/FOV$, the minimum k-space interval corresponding to the desired FOV. The composite MR signal then becomes:

$$S_m^{comp}(k_x, k_y) = \int\int dx dy C_m^{comp}\rho(x,y)\exp\{-ik_x x - ik_y y\} =$$
$$\int\int dx dy C_o^{comp}\rho(x,y)\exp\{-ik_x x - i(k_y - m\Delta k_y)y\} \quad [4]$$

Therefore this new combination can be substituted to shift the measured k-space data by an amount $(-m\Delta k_y)$.

When a total of M spatial harmonics are formed from M different linear combinations of component coil signals (including the original homogeneous combination), then M lines of k-space may be reconstructed for each application of a phase encoding gradient. This procedure partially replaces gradient based spatial phase encoding by an analogous spatial encoding procedure tied to the RF coil array, by using the linear combination of component coil signals to produce spatial modulations of precisely the same sinusoidal form as the modulations normally produced by gradients. Thus, the SMASH procedure acquires signal data sets with a reduced number of phase encoding gradient steps, using various component coils combined with appropriate linear combinations to fill in the remainder of k-space required for an image with given spatial resolution and FOV. Since phase encoding gradient steps constitute the temporal bottleneck in most traditional MR imaging, the omission of all but 1/M gradient steps effectively results in an M-fold increase in imaging speed.

Figure 1A:
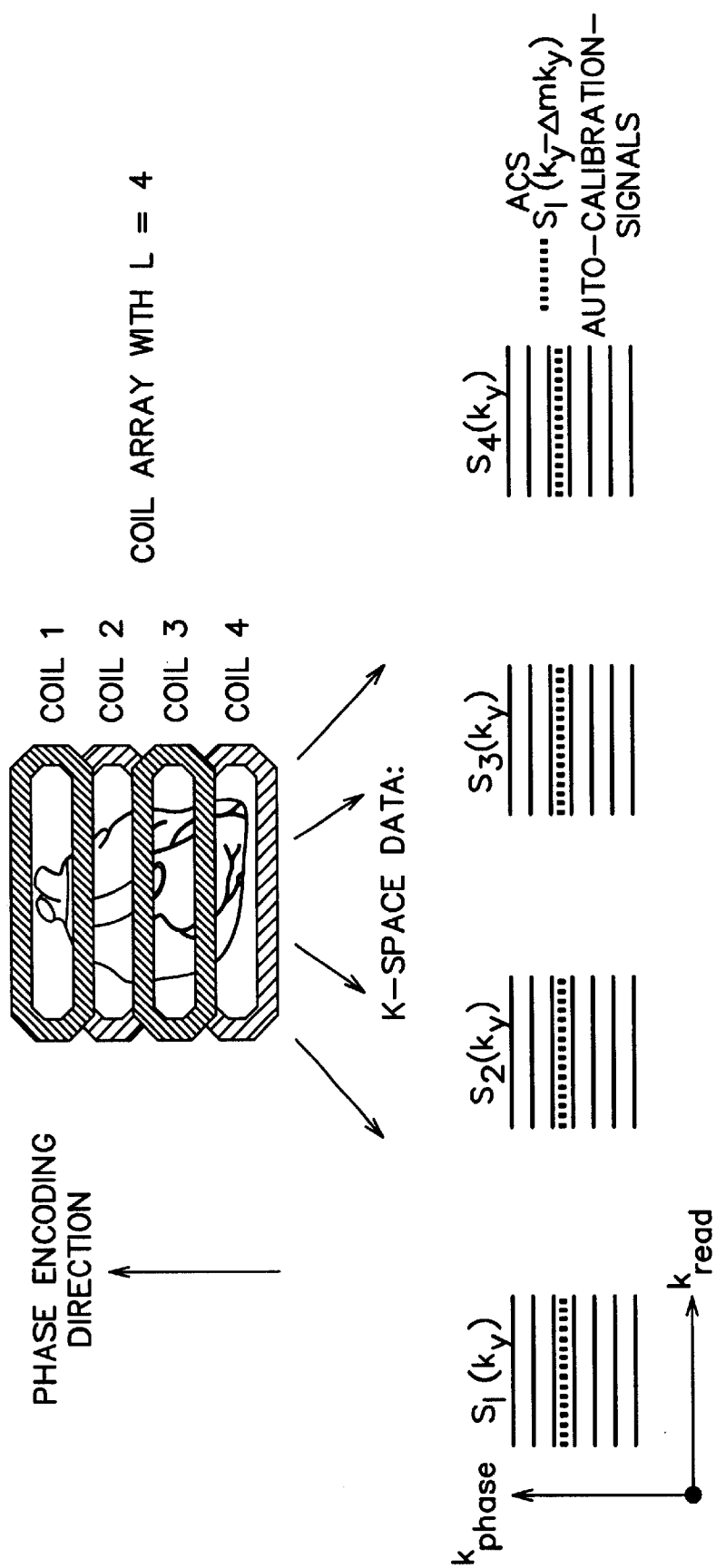
FIGS. 1A–1C show schematic representations of a SMASH MR imaging procedure compared to the AUTO-SMASH implementation of the present invention for a four coil cardiac array and M=2 spatial harmonics.
Figure 1B:
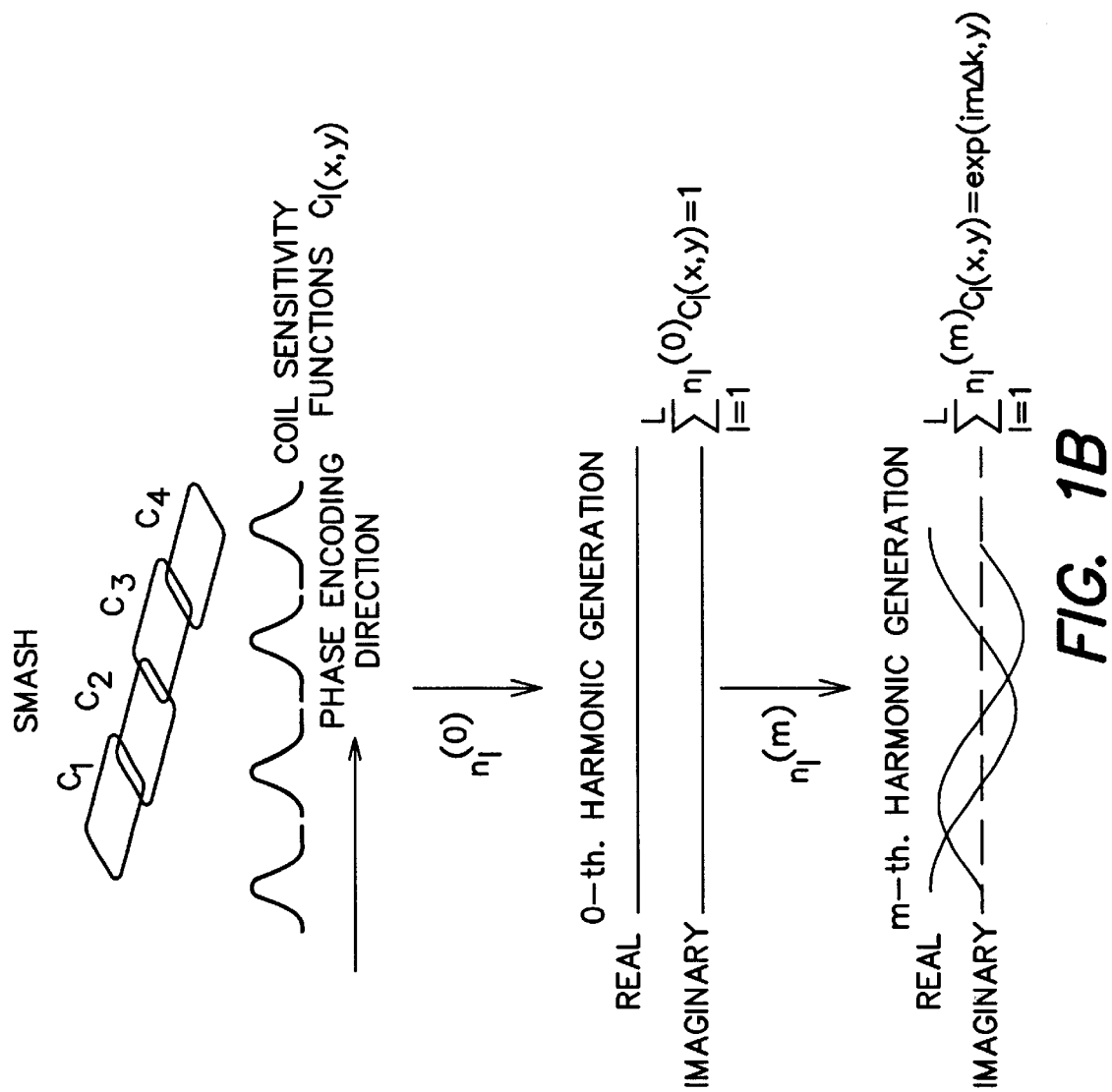
Figure 1C:
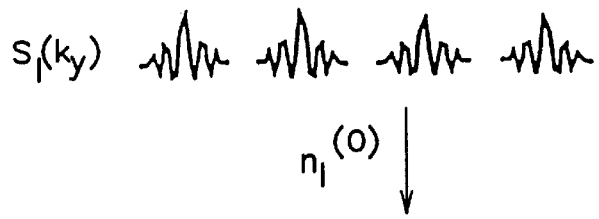

In accordance with a basic aspect of the present invention, an internal calibration procedure using a small number of additional signals is used to transform the signals received for each encoding step into multiple distinct entries of the signal data matrix. This is illustrated for the k-space SMASH procedure in detail below. Several steps of the SMASH and AUTO-SMASH reconstructions are shown schematically in FIGS. 1A, 1B and 1C. FIG. 1A illustrates schematically a linear coil array with four coil elements and schematic k-space trajectories indicated by horizontal lines. In this representation every second line is measured, as indicated by the solid lines. For the AUTO-SMASH calibration, one or more extra sampled k-space lines, indicated by dashed lines in the FIGURE, are acquired while imaging to serve as autocalibration (ACS) signals for the AUTO-SMASH procedure. Thus, for both SMASH and AUTO-SMASH, the coils are placed over the tissue of interest and a reduced set of gradients are applied (for a given resolution and FOV) corresponding to different k-space positions, shown as offset solid lines in the signal measurement matrix. Each coil receives a signal during each conditioning step. FIGS. 1B and 1C show corresponding processing of SMASH (FIG. 1B) and AUTO-SMASH procedures (FIG. 1C), respectively. As shown on the left side in FIG. 1B, the SMASH procedure operates using knowledge of the position-dependent sensitivities of the individual coils in the RF coil array, to form weighted combinations of signals from each of the coils that approximate the required sinusoidal modulations in receiver sensitivity across the FOV. The FIGURE illustrates coil weightings applied to generate two linear combinations of coil signals corresponding to the zeroth and first spatial harmonic. The combined coil sensitivity profiles are indicated by solid lines. The appropriate composite shifted k-space signals so formed, are inserted into the k-space matrix to obtain a full set of lines.

Thereafter, the reconstructed SMASH image is obtained by Fourier transformation of this matrix in a conventional manner.

As noted above, the formalism for SMASH reconstruction relies upon the accurate knowledge of the RF coil sensitivity of each surface coil in the array in order to determine the optimal complex weights, $n_l^{(m)}$ for forming synthetic signals which correspond to the signals which would be received by a number of modeled coils having spatial harmonic receiving sensitivity. In the reported SMASH implementations, this determination was made by fitting measured coil sensitivity data to the target spatial harmonic sensitivity profiles, using additional coil sensitivity weighted reference data sets. However, as indicated above, the present invention provides an improved method of determining sensitivity-related reconstruction coefficients, resulting from applicant's realization that the set of optimal complex weights, $n_l^{(m)}$, necessary for SMASH postprocessing can also be determined from simple transformations between signals by using a small number of additionally recorded autocalibration (ACS) magnetic response signals, which are acquired for offset regions of k-space. The processing of such signals avoids the need for making explicit coil sensitivity measurements. That is, when information from these extra signals is incorporated into the reconstruction, the set of linear weights may be extracted automatically from the signal data for each acquisition without the intermediate step of determining coil sensitivity measurements. Since only one or a few ACS signals need be acquired, this auto-calibrating approach can be easily implemented with almost as great an overall time savings as that afforded by SMASH imaging.

The derivation of multiple lines of k-space data from uncalibrated coil signals and additional autocalibration signals is achieved as follows. It will be recalled that in SMASH, linear combinations of component coil signals are used to generate composite signals shifted by an amount $(-m\Delta k_y)$ in k-space. In AUTO-SMASH a few extra navigator ACS-lines are acquired during the actual scan which are exactly shifted by the same amount $(-m\Delta k_y)$. This condition is readily fulfilled simply by applying the corresponding gradient conditioning step for acquiring such an offset signal. Relations between the SMASH data set and these extra ACS-data are then used to extract the desired optimal complex weights, $n_l^{(m)}$, as follows.

First consider the composite signal generated by uniform combination of component coil signals $S_l^{ACS}(k_x, k_y - m\Delta k_y)$ at position $(k_y - m\Delta k_y)$ in k-space:

$$S^{comp}(k_x, k_y - m\Delta k_y) = \sum_{l=1}^{L} n_l^{(0)} S_l^{ACS}(k_x, k_y - m\Delta k_y)$$

$$= \int\int dx dy \sum_{l=1}^{L} n_l^{(0)} C_l(x, y) \rho(x, y) \exp\{-ik_x x - i(k_y - m\Delta k_y)y\}$$

Alternatively, as outlined in the previous section, the same composite signal may formed by appropriate combinations of signals $S_l(k_x, k_y)$ at position $k_y$ in k-space, through generation of a spatial harmonic of order m which has already been shown to produce a k-space shift of $-m\Delta k_y$.

$$S^{comp}(k_x, k_y - m\Delta k_y) = \sum_{l=1}^{L} n_l^{(m)} S_l(k_x, k_y) \qquad [6]$$

$$= \int\int dx dy \sum_{l=1}^{L} n_l^{(m)} C_l(x, y) \rho(x, y) \exp\{-ik_x x - ik_y y\}$$

A simple comparison of Eq. [5] with Eq. [6] yields $$\sum_{l=1}^{L} n_l^{(m)} S_l(k_x, k_y) = \sum_{l=1}^{L} n_l^{(0)} S_l^{ACS}(k_x, k_y - m\Delta k_y) \qquad [7]$$

It follows that if extra k-space lines $S_l^{ACS}(k_x, k_y - m\Delta k_y)$ are acquired as autocalibration signals during a SMASH acquisition, a composite reference line $S^{comp}(k_x, k_y - m\Delta k_y)$ may be formed from these signals. The SMASH lines $S_l(k_x, k_y)$ may then be fitted directly to the reference line $S^{comp}(k_x, k_y - m\Delta k_y)$ without requiring the intermediate step of spatial harmonic generation. The effect is the same as if coil sensitivities had been fitted to spatial harmonic target profiles. Similar weights $n_l^{(m)}$ are produced, since the relation between different lines of k-space remains a relation of spatial harmonics. After fitting, these same weights $n_l^{(m)}$ may be used to form the required signal combinations in a SMASH reconstruction. Thus, in accordance with a basic aspect of the present invention, a gradient encoding is performed to acquire an ACS signal set, and the transform coefficients from one signal set to the other are determined. This transform is then applied to each measurement to produce additional shifted entries in the k-space matrix. In the example illustrated above, this ACS signal is acquired at positions shifted by $m\Delta k_y$, where m is an integer.

FIG. 1C shows the steps of the AUTO-SMASH imaging procedure. For purposes of comparison, the steps of FIG. 1C are shown next to the corresponding stages of the original SMASH procedure illustrated in FIG. 1B. The AUTO-SMASH technique uses additionally sampled ACS signals $S_l^{ACS}$ ($k_x,k_y-m\Delta k_y$), represented by dashed echoes (bottom). From these signals a composite reference line $S^{comp}$ ($k_x,k_y-m\Delta k_y$) is formed, and is presented as a single solid echo. Afterwards this composite signal $S^{comp}$ ($k_x,k_y-m\Delta k_y$) is used as a target for fitting of the four coil signals $S_l(k_x,k_y)$ which are measured signals, hence also represented as solid echoes (top). This fitting procedure is carried out to yield the optimal coil-weighting factors $n_l^{(m)}$ necessary for the final SMASH reconstruction. By fitting the signals to a composite signal acquired at a known k-space position, the AUTO-SMASH procedure does not require the intermediate step generating spatial harmonics, and, as shown above, the effect is the same as if coil sensitivities had been fitted to spatial harmonic target profiles.

Figure 2:
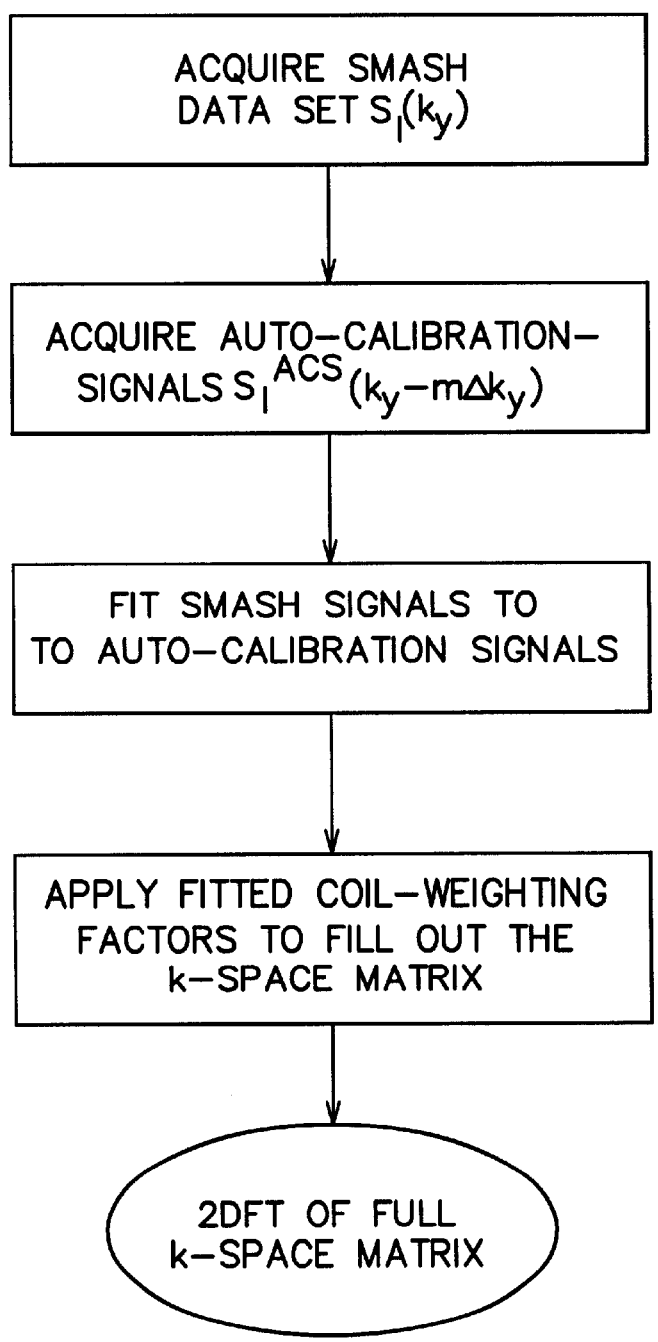
FIG. 2 is a flow chart illustrating steps in the AUTO-SMASH procedure shown in FIGS. 1A–1C.

FIG. 2 shows a flow chart of the AUTO-SMASH imaging steps.

Figure 3:
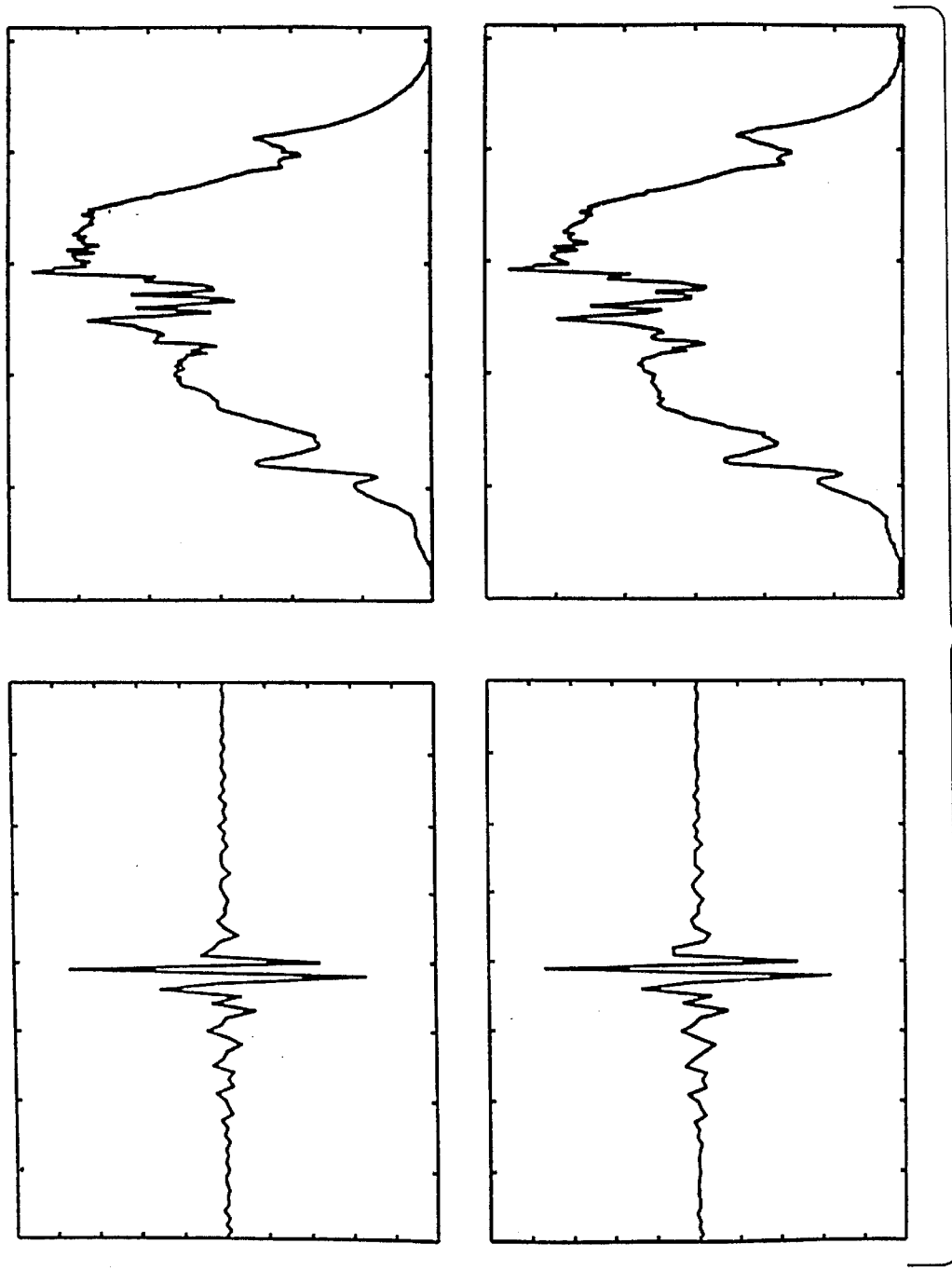
FIG. 3 shows corresponding signals formed by SMASH using the autocalibration procedure of the present invention in the signal and image domains.

FIG. 3 illustrates composite signals formed from the ACS data in comparison with composite SMASH signals in an actual AUTO-SMASH implementation. The top line of the FIGURE show the composite signal $S^{comp}$ ($k_x,k_y-m\Delta k_y$) formed by uniform combination of the ACS signals of the four coils in the array, shown on the left before Fourier transformation, and on the right after Fourier transformation). This composite ACS-signal was used as a target for fitting of the signals $S_l$ ($k_x,k_y$) as described above. The bottom two traces of FIG. 3 show the corresponding composite SMASH signals after fitting, with the signal before transformation on the left, and after Fourier transformation on the right. As shown, substantially identical values are obtained in both the signal and image domains.

In general, to carry out AUTO-SMASH imaging, the pulse sequence and gradient phase encoding tables may be modified, so that for each desired spatial harmonic function of order m, an additional signal $S_l^{ACS}$ ($k_x,k_y-m\Delta k_y$) is acquired along the $k_y-m\Delta k_y$ line in k-space during the actual scan. Thus, for every spatial harmonic, an "auto-calibration" line of data is acquired, which adds only (M−1)×T to the SMASH scan time, where T represents the repetition time or inter-echo spacing of the imaging technique which is being applied. Thus, for an array, e.g, of four coils, each having a sufficient sensitivity over the field that the above fitting procedure is well behaved, the acquisition of only three targeted ACS signals suffices to derive a set of linear transformations that transform the MR response signal received in each of the four array coils into a set of four separate lines in k-space. This procedure thus accelerates filling of the signal data set by a factor of approximately four.

Thus, the AUTO-SMASH self calibration procedure replaces an experimentally cumbersome and potentially inaccurate coil sensitivity measurement with a targeted acquisition of a few extra lines of MR signal data, and the underlying spatial harmonic modulations produced by phase encoding gradients in these extra data lines are used to train the linear combinations required for SMASH reconstruction. In an apparatus operating with this form of acquisition and processing, since it is the relations between MR signals rather than the absolute coil sensitivities which are used for determination of optimal signal weightings, the effects of spin density variations are largely eliminated and the AUTO-SMASH imaging may be used even in regions of markedly inhomogeneous spin.

FIGS. 2A–2C illustrate the flexibility of the ACS method. Measured SMASH signals $S_k^{ij}$ (or, as discussed below, other sparse signal lines) are indicated by bold traces and the corresponding ACS acquisitions are indicated by narrow line traces. As shown in FIG. 2A, the ACS may be acquired before, during, or after the principal PPA imaging sequence, or may be acquired in a separate scan. FIGS. 2B and 2C show different temporal acquisition strategies for an echo planar imaging experiment.

Since the described transformations represent relationships between received signals given the known encoding, they automatically correct for certain errors that might arise when starting from a coil calibration procedure. The ability to acquire ACS references at a desired time in the conditioning cycle further allows one to limit the extent of any variations that might be introduced by evolving magnetization. Furthermore, the ACS lines may be acquired at different k-space positions. A great variety of acquisition strategies are possible.

Figure 3A:
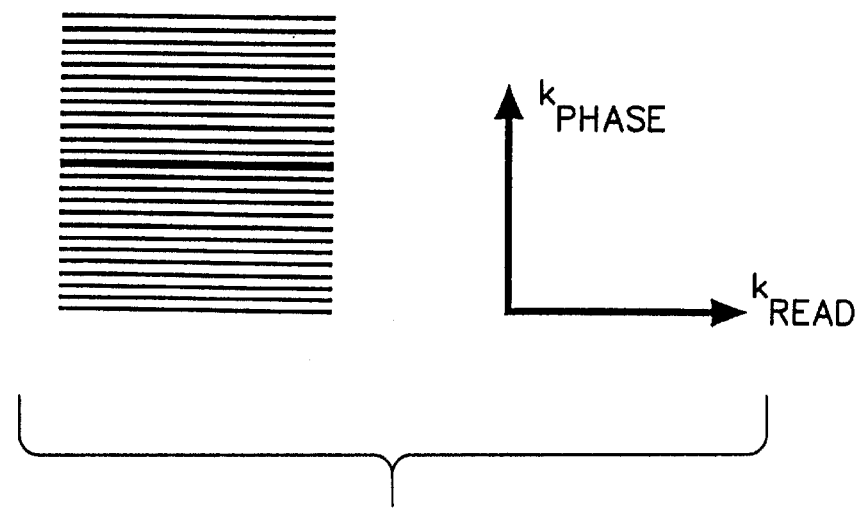
FIGS. 3A–3G show k-space representations of different calibration signal acquisitions in accordance with the invention.
Figure 3B:
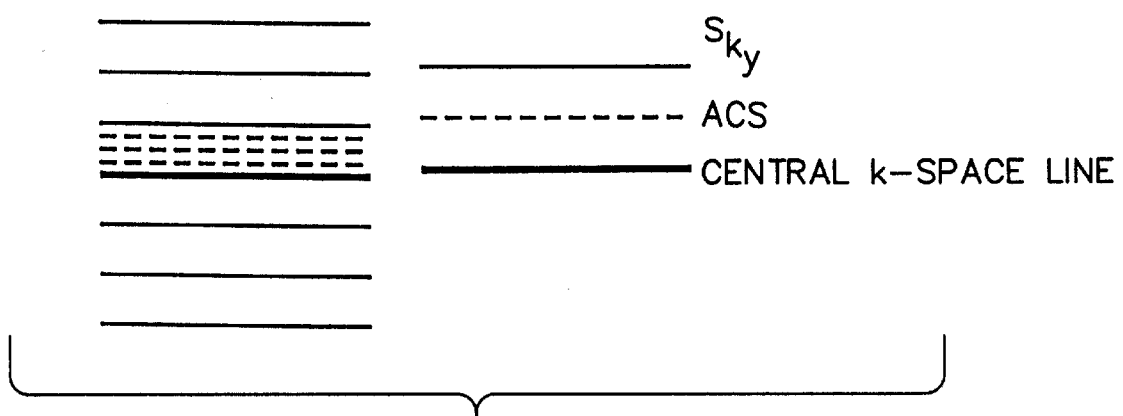
Figure 3C:
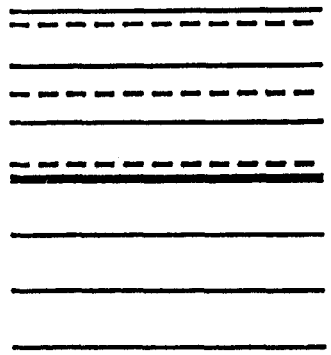
Figure 3D:
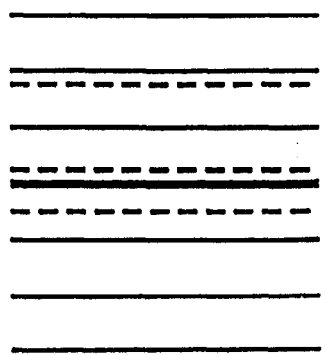
Figure 3E:
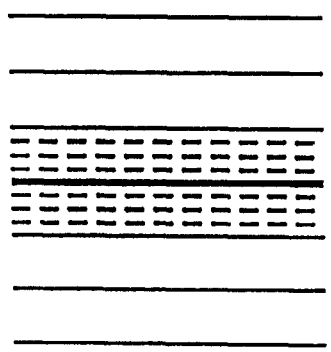
Figure 3F:
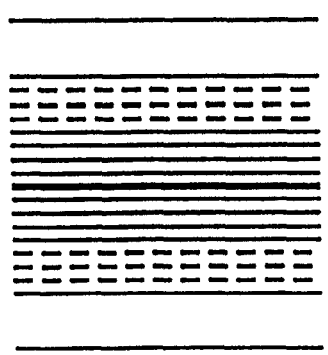

Thus, for example, to fill the prior art k-space set of FIG. 3A, in which the broad horizontal line indicates the central k-space line and the solid lines around it indicate the normal full set of acquisitions, one may employ different acquisition strategies. Several representative methods are shown in FIGS. 3B–3F. Several ACS acquisitions may be performed on one side of the central line as shown in FIG. 3B, or on both sides as shown in FIG. 3E. One extra acquisition may be performed, with different offsets, near each of several measured lines (FIG. 3C), or several may be acquired near the center and a one or more others further out (FIG. 3D). It is also possible to acquire all the ACS near the edge or edges of k-space,and to use actual measurement lines at the central region, thus speeding acquisition time or enhancing quality of the fine features of interest.

Figure 3G:
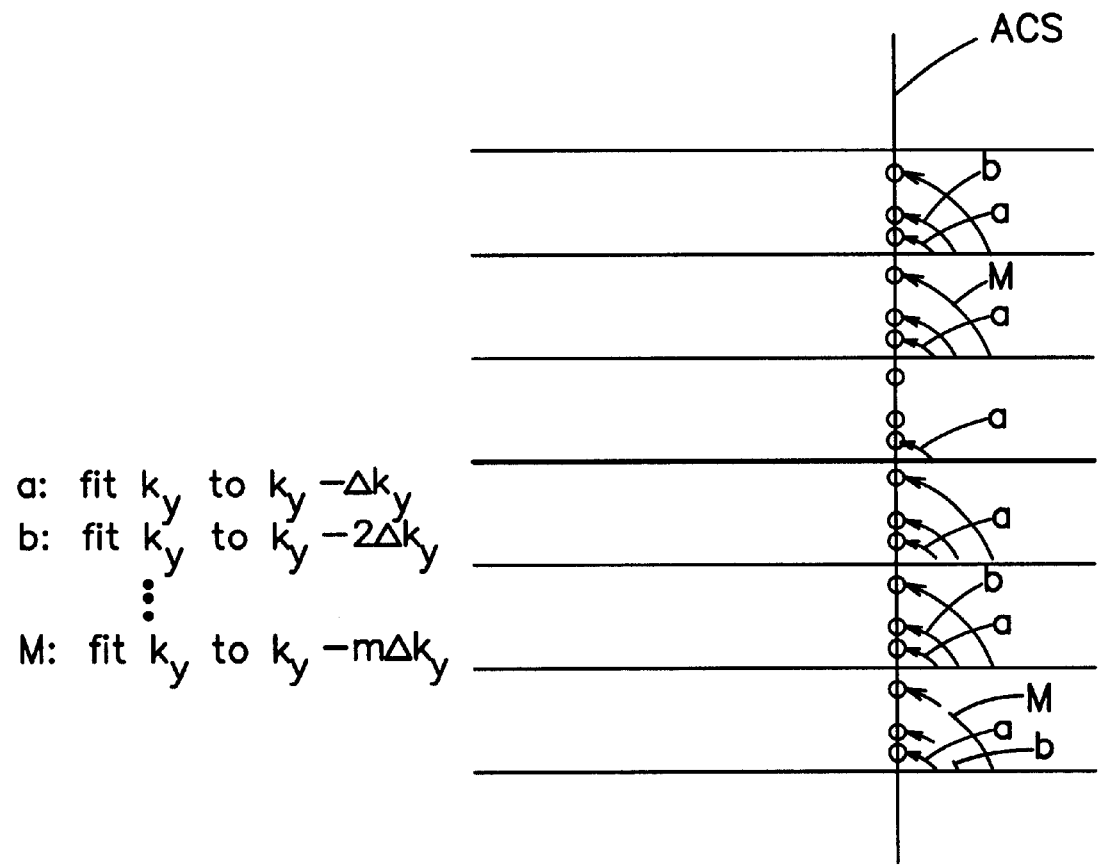

Furthermore, as illustrated in FIG. 3G, one or more ACS may be acquired with the encoding direction oriented so that the acquired ACS crosses the measured signal lines. This permits one to simultaneously fit many lines to the ACS signal, and derive the transformations for multiple intermediate lines at once. These are indicated by the maps a, b and M for transforming the $k_y$ to the $k_y-\Delta k_y$, $k_y-2\Delta k_y$, up to $k_y-M\Delta k_y$ signal lines, respectively. In this case, a single ACS yields the signal transformation for producing all the intermediate lines.

Figure 3H:
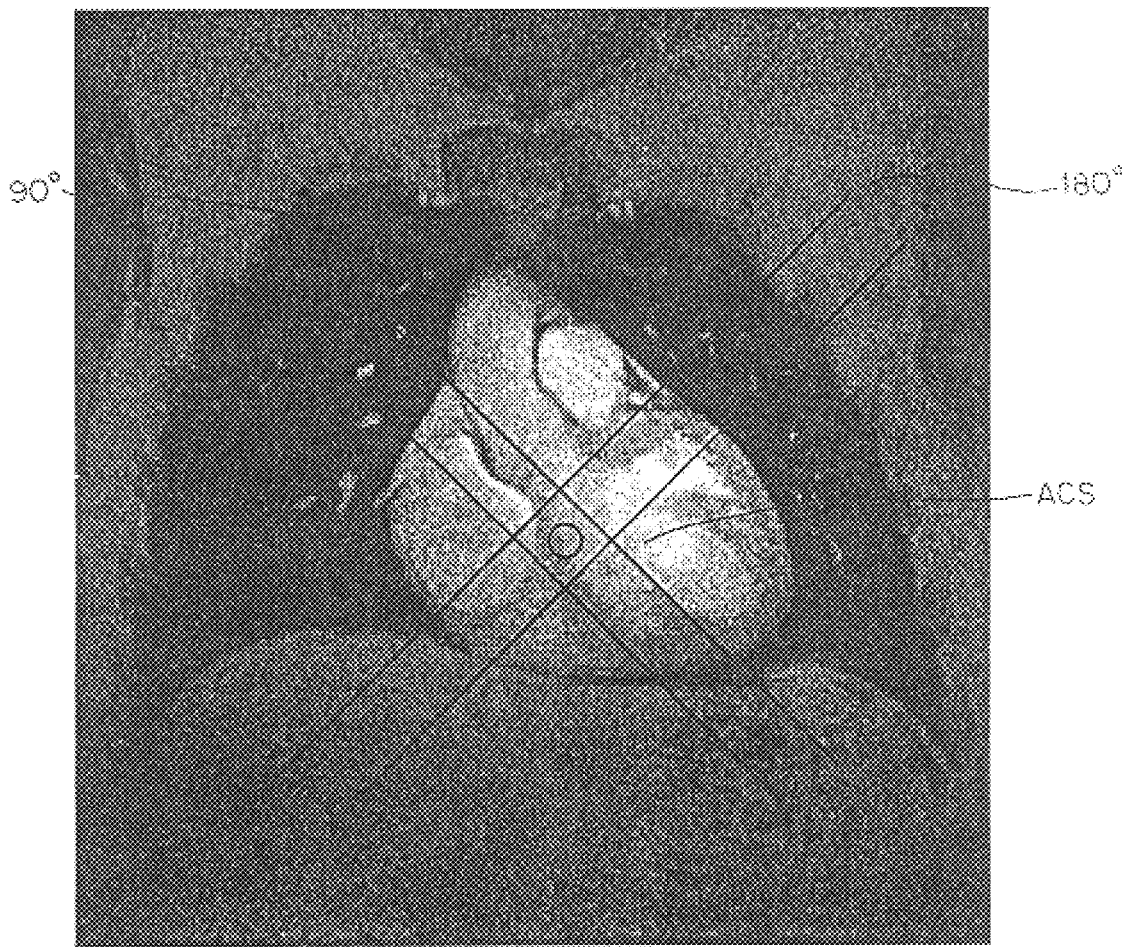
FIG. 3H shows a tissue-selective calibration signal acquisition of the invention.

Because the ACS signals are acquired over a region, they inherently smooth the contributions of individual features, and the fitting procedure reflects the spatial information of the encoding step that produced them. However, it is further possible to assure that the received ACS provides a good fit for a particular region of tissue by being spatially selective in acquiring the signal. FIG. 3H shows one method of acquiring a tissue-selective calibration signal. By conditioning and interrogating with a 90°–180° pulse pair, or other spatially selective technique, only the small volume of tissue at the intersection of the two crossed planes is excited, so the ACS signal emanates solely from that volume, and fitting to this signal thus corrects the received coil signals to faithfully image that volume.

EXAMPLES AND METHODOLOGY

The foregoing method was implemented in an MR imaging apparatus to produce representative images in a number of cardiac imaging situations. All raw data were generated on a Siemens Vision 1.5 Tesla whole body clinical MR scanner (Siemens Medical Systems, Erlangen, Germany), a device with a resonant EPI capability with minimum gradient rise time of 300 µs, or a non-resonant rise time of 600 µs to a peak gradient amplitude of 25 mT/m along all three axes. A prototype cardiac coil array with four overlapped component coils, having a total spatial extent of 260 mm in the phase encoding direction and 230 mm in the read direction, was used for all cardiac scans. The array extended in the head-foot direction and was used in a receive-only mode, with the body coil providing homogeneous excitation. During transmit, the array was actively decoupled from the body coil. The individual coil data were exported to a Hewlett-Packard 735 UNIX workstation for postprocessing. Fitting of the coil weighting functions and image reconstruction were performed as described above using the readily available Matlab programming environment (The Mathworks, Natick, Mass.).

Example 1

Figure 4A:
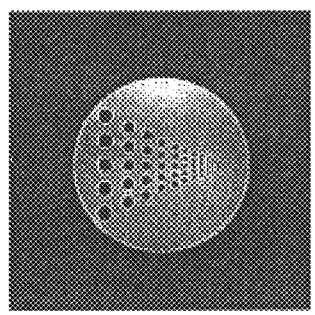
FIG. 4 is an array of images of a phantom, comparing reference, SMASH, and AUTO-SMASH reconstructions.
FIG. 4F is a table of component coil weights for the reconstructions of FIG. 4.
Figure 4A:
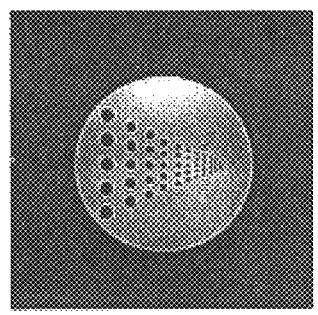
Figure 4B:
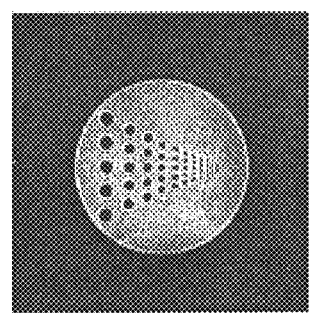
Figure 4B:
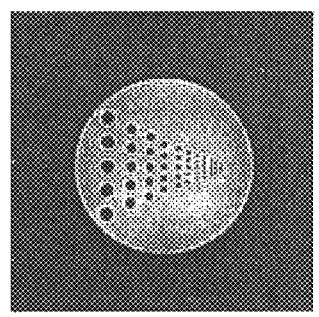

In one test, to assess the performance of the AUTO-SMASH approach in a well-controlled experiment, a resolution phantom was imaged using the 4-element array. Images were acquired in an 8 mm thick coronal slice parallel to and approximately 60 mm above the plane of the array. A FLASH imaging sequence was used, with TE=6 ms, TR=12 ms, and flip angle=15°. Phase encoding was performed in the direction of the array. The FOV was 320 mm×320 mm and matrix size was 128×128 for full-time reference images acquired with no omitted gradients. The reference image is shown in FIG. 4A. Reduced time data sets with either two (left column) or three (right column) times the phase encode step (interval), and hence one half or one third the FOV and matrix size in the phase encode direction, were used for both SMASH and AUTO-SMASH reconstruction. Reference component coil images were combined using a conventional sum of squares algorithm. SMASH reconstructions used coil sensitivity information taken from intensity profiles across the center of the full FOV component coil reference images to fit either two or three spatial harmonics, as described above and in the noted SMASH reference papers. The SMASH reconstructions are shown in FIG. 4B.

Figure 4C:
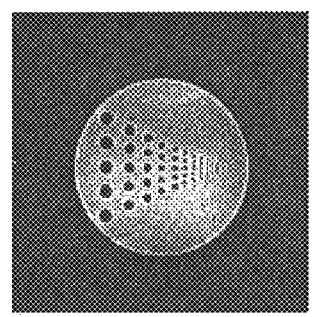
Figure 4C:
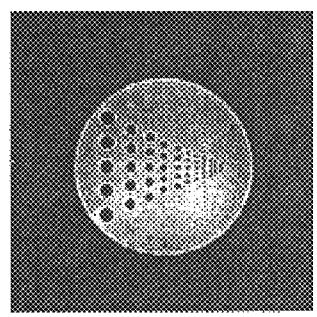
Figure 4D:
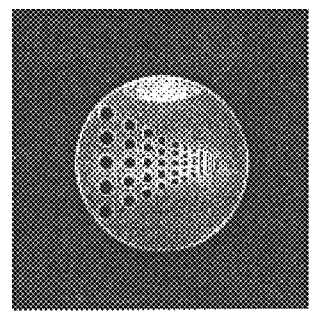
Figure 4D:
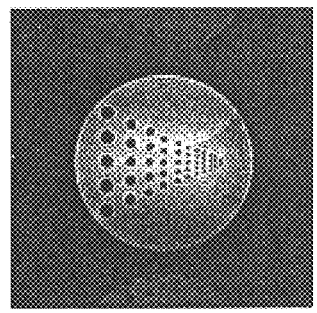

The AUTO-SMASH reconstructions used additional autocalibration signals acquired with appropriate offsets corresponding to the first and second spatial harmonics to determine signal weight factors. These images are shown in FIGS. 4C and 4D. In order to test the robustness of the AUTO-SMASH fitting procedure, a first AUTO-SMASH reconstruction was performed using high signal-to-noise ratio (SNR) echoes in the center of k-space (shown in FIG. 4C), and a second AUTO-SMASH reconstruction was performed using low SNR echoes from the edge of k-space (shown in FIG. 4D). Among these alternative AUTO-SMASH reconstructions, the high SNR signals produced a reconstruction similar in quality to the SMASH image, while the reconstruction relying on signals from the edge of k-space exhibited a slightly greater degree of aliasing. It should be noted that the choice of reference weights $n_l^{(0)}$ for SMASH or AUTO-SMASH reconstructions is arbitrary; however that choice will be reflected in the overall intensity profile of the reconstructed image. For the phantom images of FIG. 4, reference weights yielding the most homogeneous intensity profile possible (i.e. approximately a flat zeroth spatial harmonic) were used.

Finally, a set AUTO-SMASH images was formed, which were reconstructed using deliberately mistuned coil-weighting factors. The weighting factors for second and third spatial harmonics were arbitrarily chosen to be replicas of the zeroth harmonic reference weights. These inappropriate weights were used in order to demonstrate the nature of image artifacts which arise when no effort is made to obtain correct coil weighting information from the ACS. This substitution produced markedly inferior images, shown in FIG. 4E.

FIG. 4F is a table showing the fitted weighting factors obtained in the case of two spatial harmionics for each of the SMASH and AUTO-SMASH reconstructions of FIGS. 4B–4E. As shown, the weights determined by the AUTO-SMASH signal mapping procedure near the center of k-space (line 2 of the Table, FIG. 4C) were quite close to the coil weightings determined by the SMASH coil sensitivity mapping procedure (line 1 of the Table, FIG. 4B).

Example II

A principal motivation for the development of both the SMASH and AUTO-SMASH procedures was to improve cardiac imaging. Since SMASH effectively allows multiple acquisitions to proceed simultaneously, it may be used to gather high resolution information in a given acquisition time, or else to acquire images of a given spatial resolution in a shorter acquisition time. Thus, the SMASH technique, when supplemented with AUTO-SMASH calibration, offers a possible remedy for the competing constraints of spatial versus temporal resolution in cardiac MRI. A methodical study of cardiac imaging with two different acquisition strategies was therefore undertaken in order to confirm the benefits of AUTO-SMASH for such imaging. These are referred to as strategy I and strategy II below.

STRATEGY I. Since a reduction in breath-hold times is particulary important for patients with cardiac disease for whom current long breath-hold times are impractical, the AUTO-SMASH strategy was used to reduce breath-hold durations by a factor of two to three while maintaining constant spatial resolution.

STRATEGY II. Alternatively, the breath-hold time was held constant, and AUTO-SMASH was used to double the spatial resolution in the phase encoding direction, in combination with a doubled resolution in the read-out direction. This second strategy results in an increased spatial resolution for a given breath-hold time.

Nine healthy volunteers (two female, seven male; age range 21–64 years) were examined according to the guidelines of the internal review board of the Beth Israel Deaconess Medical Center. Informed consent was obtained before each study. For all the studies presented here, cardiac AUTO-SMASH images with two and three harmonics (M=2 and 3) were acquired using a segmented turbo FLASH sequence. The segmented turbo FLASH sequence was selected for all our cardiac SMASH studies, since it is a widely used clinical technique for cardiac imaging and is easy to combine with the SMASH approach.

The following imaging protocols were used for both strategies I and II.

For strategy I, two sequences with 9 or 5 k-space lines per segment were used. These were:

(1) Segmented turbo FLASH with 9 lines per segment: flow compensation in slice and read direction, and incremented flip angle series (18, 20, 22, 25, 31, 33, 38, 48, and 90°). A TR of 14.4 ms and a TE of 7.3 ms resulted in an effective temporal resolution of 131 ms. The image matrix was either 144×256 (for the reference) or was a 72×256 matrix (for AUTO-SMASH, reconstructed to 144×256).

(2) Segmented turbo FLASH with 5 lines per segment: flow compensation in slice and read direction, constant flip angles between 30° and 40°. A TR of 11.8 ms and TE of 6.1 ms resulted in an effective temporal resolution of 59 ms. The image matrix was 240×256 (for the reference) or 80×256 (for AUTO-SMASH, reconstructed to 240×256).

For strategy II, segmented turbo FLASH sequences with 9 lines per segment and an image matrix of 144×256 (for the reference) or a matrix of 144×512 (for AUTO-SMASH, reconstructed to 288×512) were used.

For coronary imaging a chemical shift selective fat-saturation pulse was applied before each segment to null the signal from epicardial fat and thus enhance the contrast of coronary blood flow. The data were acquired in 5–9 mm thick slices, either in a coronal orientation or in an oblique plane extending from the coronal to the sagittal direction. Prospective ECG-gating was used to place the acquisition of each segment in mid diastole. All images were obtained during a single end-expiratory breathhold with the subjects in a prone position above the coil array.

As in the phantom experiment of EXAMPLE 1, reference images were combined using a sum of square algorithm. Since in vivo sensitivity references were not readily available due to the marked variation in spin density across the thorax, AUTO-SMASH was used to obtain component coil weighting factors. In all cases, a reduced data set plus one or two extra ACS lines with appropriate offsets corresponding to the first and the second spatial harmonics were acquired.

For the in vivo implementation, only high SNR echoes in the center of k-space were used as ACS. For convenience, uniform reference weights $n_l^{(0)}=1$ were used for the in vivo images, which still corresponded to roughly homogeneous overall intensity profiles.

Figure 5:
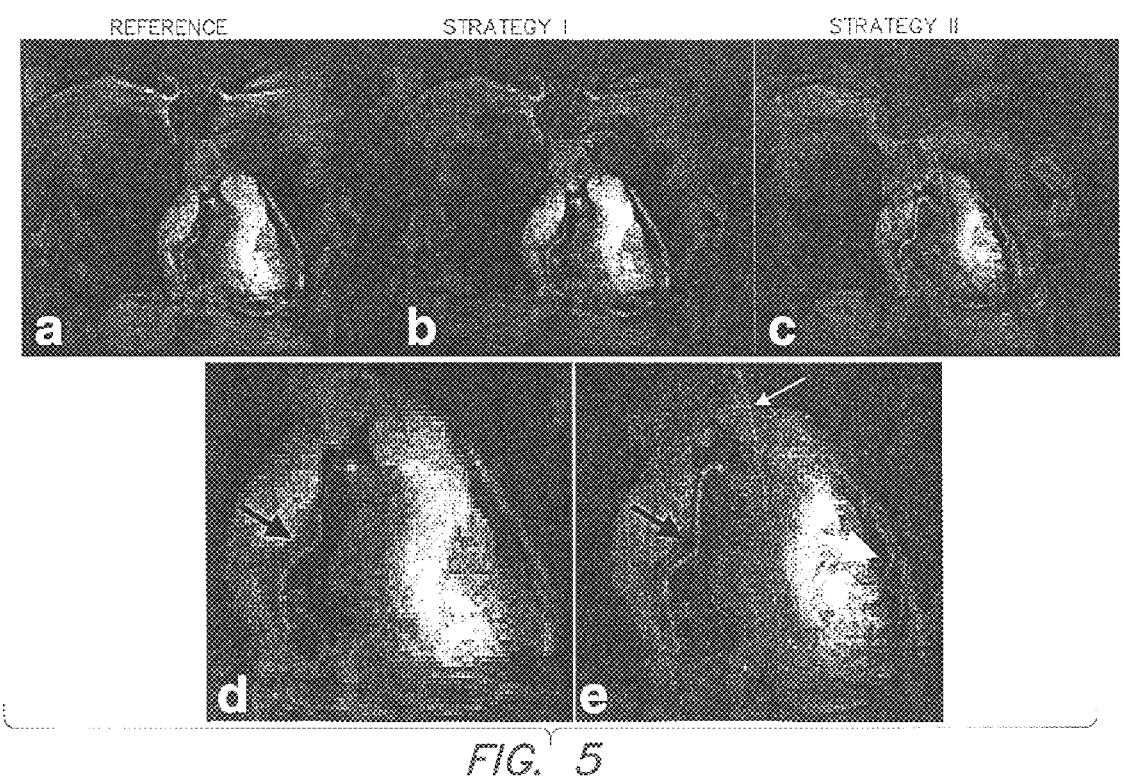
FIGS. 5A–5E show a conventional cardiac image, and corresponding faster and higher resolution images made in accordance with the present invention, illustrating features not visible in the conventional image.
Figure 6:
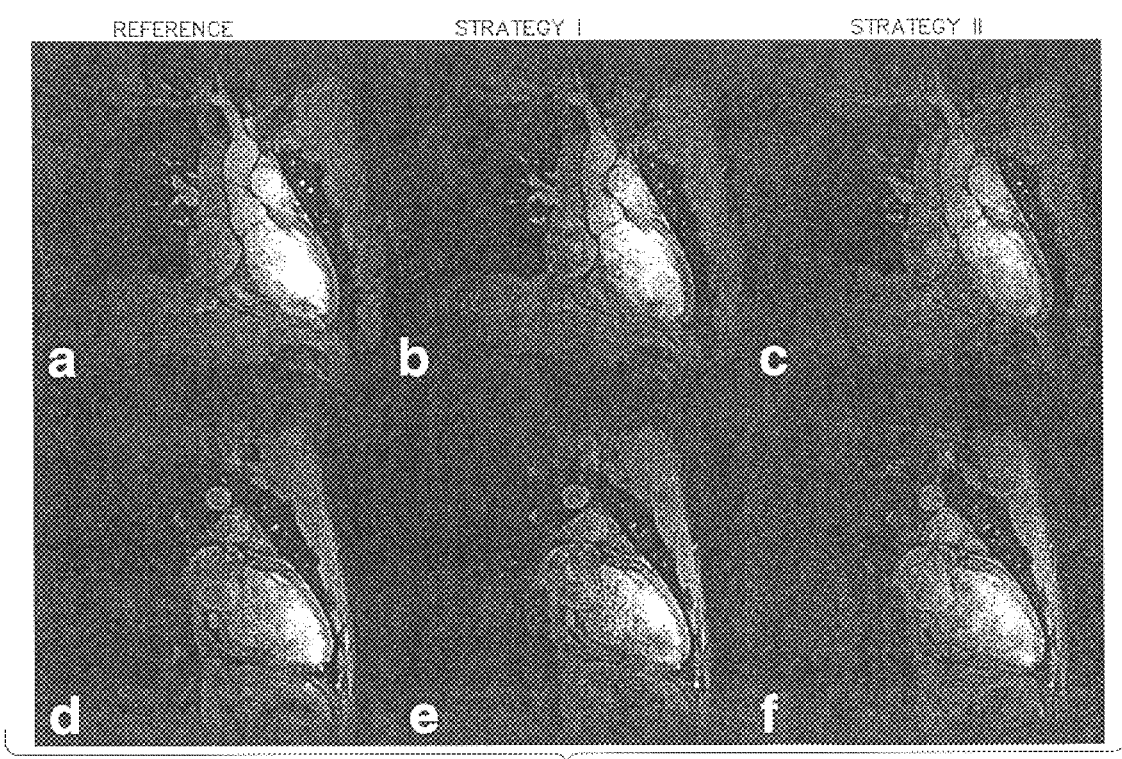
FIGS. 6A–6C and 6D–6F show two sets of comparative cardiac images along various slices, each triad corresponding to a full time EKG-gated image (6A, 6D), a half-time AUTO-SMASH image (6B, 6E) and an AUTO-SMASH double resolution image (6C, 6F)
Figure 7:
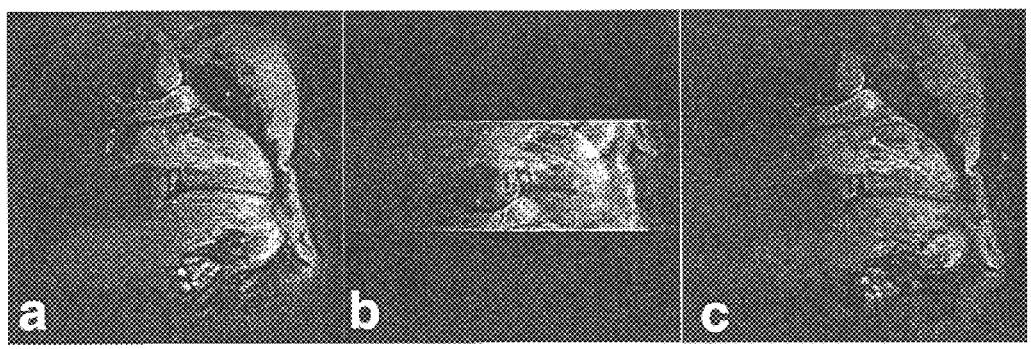
FIGS. 7A–7C show another set of comparative cardiac images illustrating the fast imaging of the present invention.

The images in FIGS. 5 through FIG. 7 demonstrate in vivo results obtained with the AUTO-SMASH technique with two to three spatial harmonics and a nearly two-fold or three-fold increase in acquisition speed.

The images in FIG. 5A–5E show results obtained from a coronary imaging study with strategy I and II using two spatial harmonics. The data set was acquired in an 8 mm thick coronal slice parallel to and approximately 50 mm above the plane of the cardiac array. FIG. 5A (panel a) shows as a reference the full time image acquired over 16 cardiac cycles with a 144×256 matrix size. FIG. 5B (panel b) shows the corresponding half time image acquired over 8 cardiac cycles obtained with strategy I and with a 144×256 matrix size after AUTO-SMASH reconstruction. The image quality is preserved in the accelerated AUTO-SMASH image. FIG. 5C (panel c) shows the corresponding double resolution image obtained with strategy II in the same total acquisition time as the reference image over 16 cardiac cycles, with a doubled matrix size in this of 288×512 after AUTO-SMASH reconstruction.

Details from FIGS. 5A and 5C are shown in FIGS. 5D and 5E, respectively. A long segment of the right coronary artery may be seen running vertically near the midline in both these images, indicated by black arrows in both FIGURES, but is significantly sharper in FIG. 5E, the high-resolution AUTO-SMASH image. Branches of the left coronary system, indicated by the thick white arrow, may also be discerned in the higher resolution AUTO-SMASH image, whereas they are not seen in the reference image. Finally, internal mammary arteries, invisible in the reference image, may be discerned running down the center of the AUTO-SMASH image, indicated by a thin white arrow.

FIGS. 6A–6F show two additional cardiac data sets. The oblique slices extending from the coronal to the sagittal direction were obtained in a healthy subject with strategy I and II using two spatial harmonics. FIGS. 6A and 6D show as a reference the full time images acquired over 16 cardiac cycles with a 144×256 matrix size. FIGS. 6B and 6E show the corresponding images acquired in half time over 8 cardiac cycles using strategy I and the AUTO-SMASH process to again achieve a full 144×256 matrix size. Here, the image quality is again preserved in the accelerated AUTO-SMASH images. FIGS. 6C and 6F show the corresponding double resolution strategy II images with AUTO-SMASH producing an augmented 288×512 matrix size, obtained in the same time as the reference images. In the oblique images shown in FIGS. 6D–6F, the left main coronary artery may be seen near its origin. This image data set demonstrates that the AUTO-SMASH reconstruction is robust enough to accommodate a certain degree of image plane angulation. Note that the AUTO-SMASH reconstructions are almost entirely free of foldover artifacts. These cardiac examples confirm that the AUTO-SMASH allows for an accurate calibration in regions of highly nonuniform spin density, where no reliable in vivo sensitivity reference map could have been obtained.

The three panels (a)–(c) of FIGS. 7A–7C show results obtained from a cardiac study using strategy I described above, in this case with three spatial harmonics. FIG. 7B shows the one-third time aliased image from a 80×256 data matrix obtained over 16 cardiac cycles. The image was formed by combining the component coil images pixel-by-pixel as the square root of the sum of square magnitudes. FIG. 7C shows the corresponding one-third time image after AUTO-SMASH reconstruction to a 240×256 matrix size. The reduced signal collection time corresponds to three-fold reduction in breathhold-time. For image comparison a reference image, shown in FIG. 7A was obtained in 48 cardiac cycles corresponding to a breath-hold time of 40 seconds. Inspection of FIG. 7C shows that, even though there are some residual foldover and ghosting artifacts visible in the AUTO-SMASH reconstruction, the heart and the left coronary artery are well depicted in the accelerated AUTO-SMASH image.

Further Discussion

From the foregoing examples and description it will be appreciated that in avoiding the need for additional independent measurement of component coil sensitivities for spatial harmonic generation, AUTO-SMASH provides a flexible tool for internal sensitivity reference estimation. It has the major advantage that optimal component coil weights can be quickly determined for each individual scan independently, and without a significant increase in imaging time.

The theoretical basis for AUTO-SMASH, illustrated above for the spatial harmonic implementation of SMASH, presumes that the coil encoding procedure provided by the underlying coil array matches the conditions of Fourier-encoding, or in other words, that the necessary spatial harmonics may be faithfully represented by linear superpositions of component coil sensitivities. In cases for which the combined sensitivities deviate from ideal spatial harmonics, reconstruction artifacts are visible in both SMASH and AUTO-SMASH reconstructions. The phantom images of FIG. 4 illustrate the appearance of N/2 and N/3 ghosts, for the M=2 and M=3 reconstructions, respectively, for various degrees of imperfection in the component coil weights. Similar aliasing artifacts may be seen in the in vivo threefold AUTO-SMASH reconstruction shown in FIG. 7C, and are responsible for much of the apparent degradation in image quality. Thus, just as in the original SMASH procedure, any errors in spatial harmonic generation may lead to image artifacts which are not removed by the AUTO-SMASH approach. In general, AUTO-SMASH shares some of the same operating limits as SMASH. The geometry of the underlying coil array will place certain limitations on the FOV, the position across the subject, and the angulation of planes suitable for the SMASH/AUTO-SMASH reconstruction. On the other hand, the AUTO-SMASH procedure allows ACS fitting to be performed at plural regions of k-space, or using selected regions of the imaged subject, and better fitting of this type may be expected to reduce the occurrence of artifacts appearing in the prototype implementations.

Figure 4E:
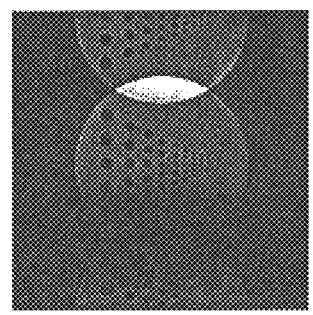
Figure 4E:
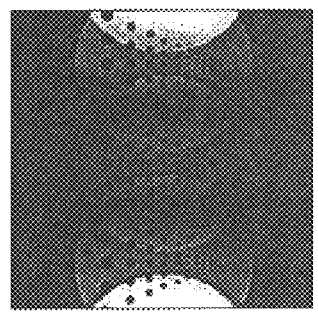

As demonstrated in the phantom study, component coil weights produced by SMASH and AUTO-SMASH are similar but not exactly the same. Just as in the coil-sensitivity fitting procedure used in SMASH, the accuracy of the self-calibration approach is affected by noise. This effect is observable in FIGS. 4C and 4D, in which the ACS's from the center and the edge of k-space were compared for image reconstruction. ACS-signals from the edge of k-space with higher noise levels produce significantly different coil-weighting factors. Although viable reconstructions were still produced, they had a partial increase in aliasing artifacts. The quality of AUTO-SMASH reconstructions using these uniformly low SNR calibration signals is also indicative of what may be expected for situations in which one or more component coils have comparatively low signal. By contrast, the use of deliberately mistuned weights produced markedly aliased images, as shown in FIG. 4E. A comparison of the two sets of images shows the degree of robustness of the AUTO-SMASH fitting procedure.

In current in vivo implementations, applicant has used as the autocalibration signals high signal-to-noise k-space lines. The invention also contemplates the use of several ACS lines for each harmonic in order to improve the determination of the optimal coil weights and the accuracy of the image reconstruction. Alternatively, one extra ACS may be acquired after switching the read and the phase encoding directions, to acquire an ACS data line running across k-space, i.e., spanning many spatial harmonics. The relations between many different harmonics $k_y$ and $k_y-m\Delta k_y$ are then derivable from this single ACS line.

In general a variety of different acquisition strategies may be employed, and may be used to optimize the postprocessing procedure in the presence of noise. Moreover, as discussed in greater detail later below, the timing of the AUTO-SMASH acquisitions may also vary. The extra ACS signal is acquired with a known spatial encoding, but may be acquired before, during, or immediately after the actual scan, or else in an independent scan.

While the foregoing description treats AUTO-SMASH in terms of extracting necessary reconstruction parameters, it may also be viewed in another way. Rather than simply producing ideal spatial harmonics, using combinations of component coil sensitivities, AUTO-SMASH reproduces as accurately as possible the actual effects of the experimentally applied phase encoding gradients. Each fit to an ACS target line constitutes an approximation of the actual gradient profiles, including any nonlinearities or other imperfections which may be present in these profiles. Thus, each fit acts as a "virtual" or "effective" gradient set, similar in structure or effect to the physically applied gradients. Reconstruction artifacts, when they occur, will result from mismatch between these effective gradient sets.

In the above-described study of healthy volunteers, diagnostic images of the heart and the coronary arteries were consistently produced and thus clearly demonstrated the potential of the AUTO-SMASH technique for cardiac imaging and MR coronary angiography. As expected, the AUTO-SMASH images obtained with strategy II showed improved spatial resolution. For fine structures predominantly oriented parallel to the phase encoding direction, such as the right coronary artery in FIG. 5E, some of the apparent improvement results from higher read-direction resolution. However, for structures such as the left main coronary artery shown in FIG. 6F running almost parallel to the read-direction, improved visibility is predominantly a result of the increased spatial resolution in the phase encode direction. One consequence of the higher spatial resolution in strategy II is a reduced SNR, as may be appreciated in the images of FIGS. 5 and 6. In addition, factors involving the component coil weightings affect SNR in SMASH and AUTO-SMASH reconstructed images. Reconstruction related SNR considerations are the same in AUTO-SMASH as in SMASH.

The invention has been described above with reference to a prototype embodiment which produces signals corresponding to spatial harmonics to fill additional k-space lines, and a simple coil array and processing assembly for enhancing image speed and/or quality for a given field of view. The described applications involve reducing acquisition time, or increasing resolution. However, the ACS method and apparatus may also be employed for quickly acquiring other forms of sensitivity data that may advantageously reduce required post-processing, provide an alternate calibration technique, or avoid certain limitations of existing partially parallel acquisition techniques. For example, the acquisition of ACS signals can be combined with the subencoding imaging technique described by J. B. Ra and C. Y. Rim, supra, which, like SMASH imaging, depends on an effective measurement of component coil sensitivities. A similar constraint is shared with other partially parallel acquisition (PPA) techniques, as well. The following discussion shows how the ACS sensitivity data may be adapted to quickly acquire data for the pixel-by-pixel unfolding reconstruction step of the Ra & Rim imaging process. In general, that procedure uses signals which are acquired simultaneously in each of multiple distinct surface coils. Images of a smaller field-of-view, reduced by a fold factor M, are acquired in a shorter (e.g., half-time) imaging sequence, where each undersampled data set thus produces an aliased image set. The Nyquist aliasing in those images is then undone by reference to the distinct sensitivities of the different receiving coils. FIG. 8B illustrates the form of such an image. More generally, each pixel in the M-fold aliased image is the sum of M points which are a certain distance apart from each other in the object. The pixels in the aliased image can be resolved, however, by having detectors (receiving coils) with distinct sensitivities. The unaliasing procedure involves a pixel-by-pixel matrix inversion to regenerate the full FOV image from multiple distinct copies of aliased image data. The prior art approach to performing this matrix inversion procedure relies on estimates of component coil sensitivities at each pixel, and thus requires that at some time,a complete FOV reference image be generated.

The present invention provides a quick and effective procedure for acquiring the necessary sensitivity information. Applicant's approach takes advantage of the fact that the spatial response function (SRF) of the component coils is normally a slowly varying function, so that a low resolution image of the objects will be adequate to serve as a measure of the SRF's.

A brief discussion of the dealiasing procedure will be helpful In the following, we assume a coil array with L components, in which each coil l has a sensitivity function $C_l(x, y)$. For simplicity we assume L=M=2. The pixel intensities in the reconstructed folded component coil images are $p_l$, and the pixel intensities in the reconstructed unfolded images are $\rho(x)$. The image intensities in the folded component coil images can be written $$p_1(x)=C_1(x)\rho(x)+C_1(x+\Delta x)\rho(x+\Delta x)$$

$$p_2(x)=C_2(x)\rho(x)+C_2(x+\Delta x)\rho(x+\Delta x) \qquad \text{(I)}$$

From Eq. (I) follows that the image intensities in the unfolded image are:

$$\rho(x) = \frac{p_1(x)C_2(x+\Delta x) - p_2(x)C_1(x+\Delta x)}{C_1(x)C_2(x+\Delta x) - C_2(x)C_1(x+\Delta x)} \qquad \text{(II)}$$

$$\rho(x+\Delta x) = \frac{p_1(x)C_2(x) - p_2(x)C_1(x)}{C_2(x)C_1(x+\Delta x) - C_1(x)C_2(x+\Delta x)} \qquad \text{(III)}$$

Equation (I) can also be written as:

$$\begin{bmatrix} p_1(x) \\ p_2(x) \end{bmatrix} = \begin{bmatrix} C_1(x) & C_1(x+\Delta x) \\ C_2(x) & C_2(x+\Delta x) \end{bmatrix} \begin{bmatrix} \rho(x) \\ \rho(x+\Delta x) \end{bmatrix} \qquad \text{(IV)}$$

or, as a matrix equation, $$\vec{p} = \tilde{C}\vec{\rho} \qquad \text{(V)}$$

From Eq. (V), after matrix inversion, follows:

$$\vec{\rho} = \tilde{C}^{-1}\vec{p} \qquad \text{(VI)}$$

From equation (VI) it follows that the full FOV image can be reconstructed from the aliased data sets when the coil sensitivities are known. In the original Ra & Rim procedure the determination of coil sensitivities was made by acquiring an additional full FOV image data set during an independent scan. However in accordance with this aspect of the present invention, this information is developed by acquiring additional auto-calibration signals as described in this section to complete multiple lines in the center of k-space. Specifically, as in the original implementations of this technique, applicant collects a sparse or undersampled signal set. Applicant further acquires a number of ACS signals in the center of k-space effective to fully sample low spatial frequency data up to a cutoff frequency. Above that frequency, only sparse signals are collected. The coil sensitivity functions are slowly spatial varying functions with smooth transitions, and can thus be faithfully represented by a low resolution data set, i.e., a full FOV set of frequency-limited data.

Applicant's reconstruction process includes the step of Fourier transforming the fully characterized but truncated low frequency data to form low pass filtered coil sensitivity weighted images, which may be further processed to provide the coil sensitivity functions. The coil sensitivity information is then used in Equation (VI) for the pixel intensity maps to unwrap the aliased image.

Figure 8A:
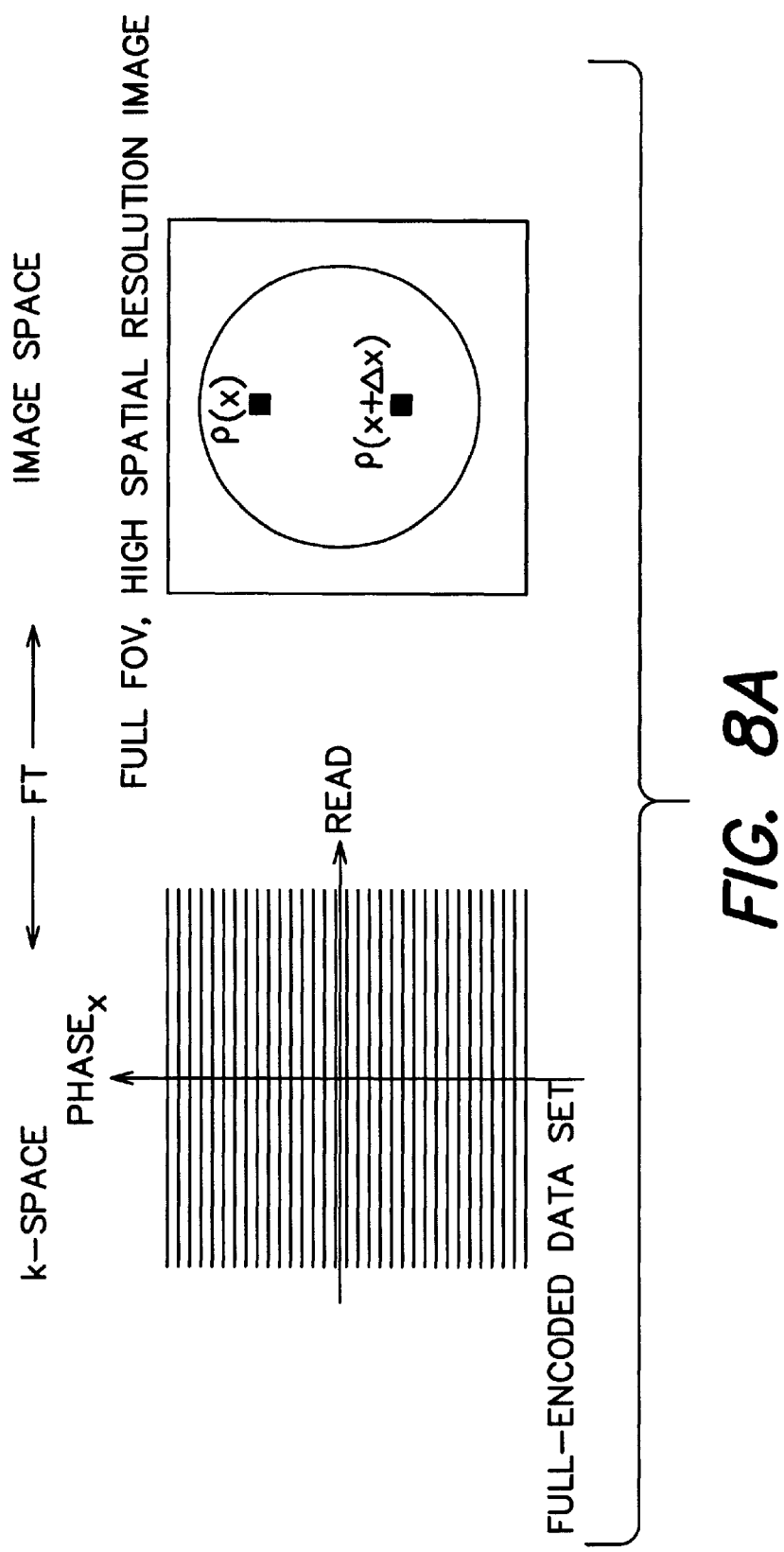
Figure 8B:
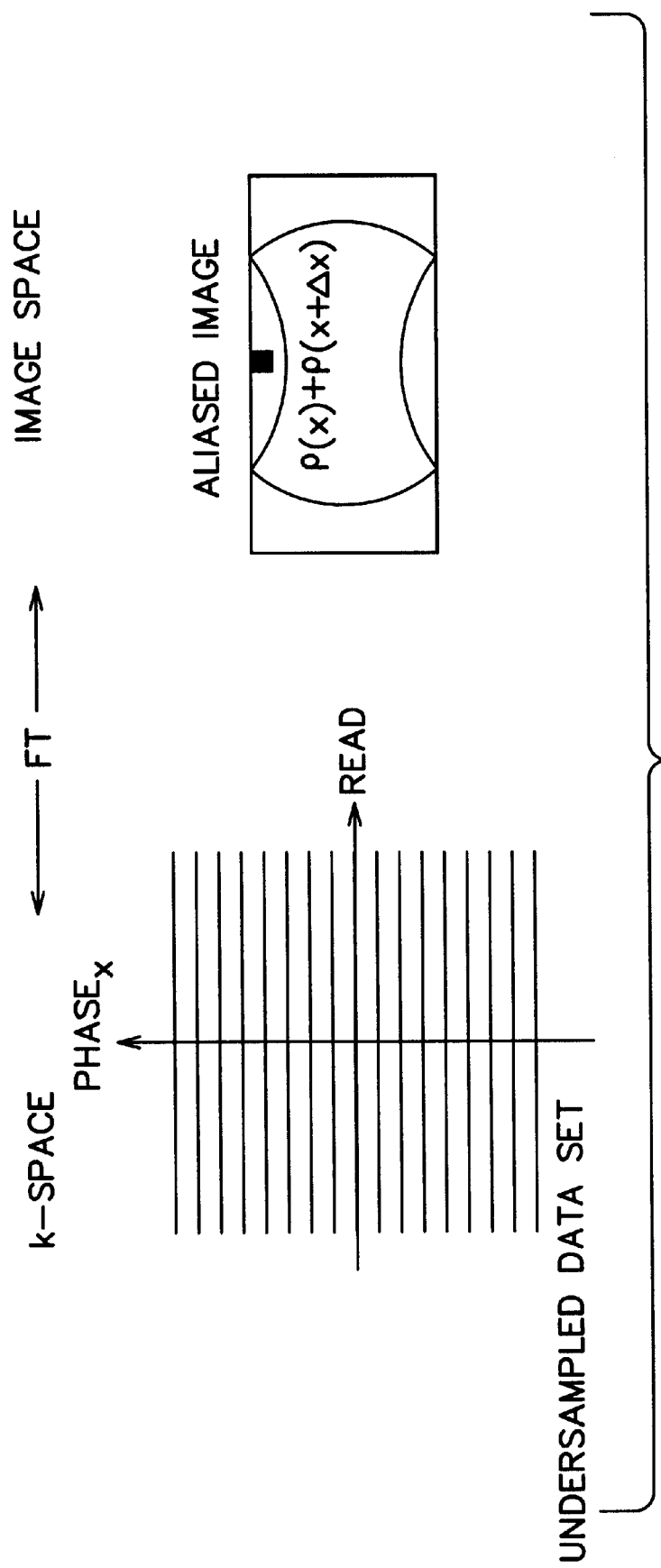
Figure 8C:
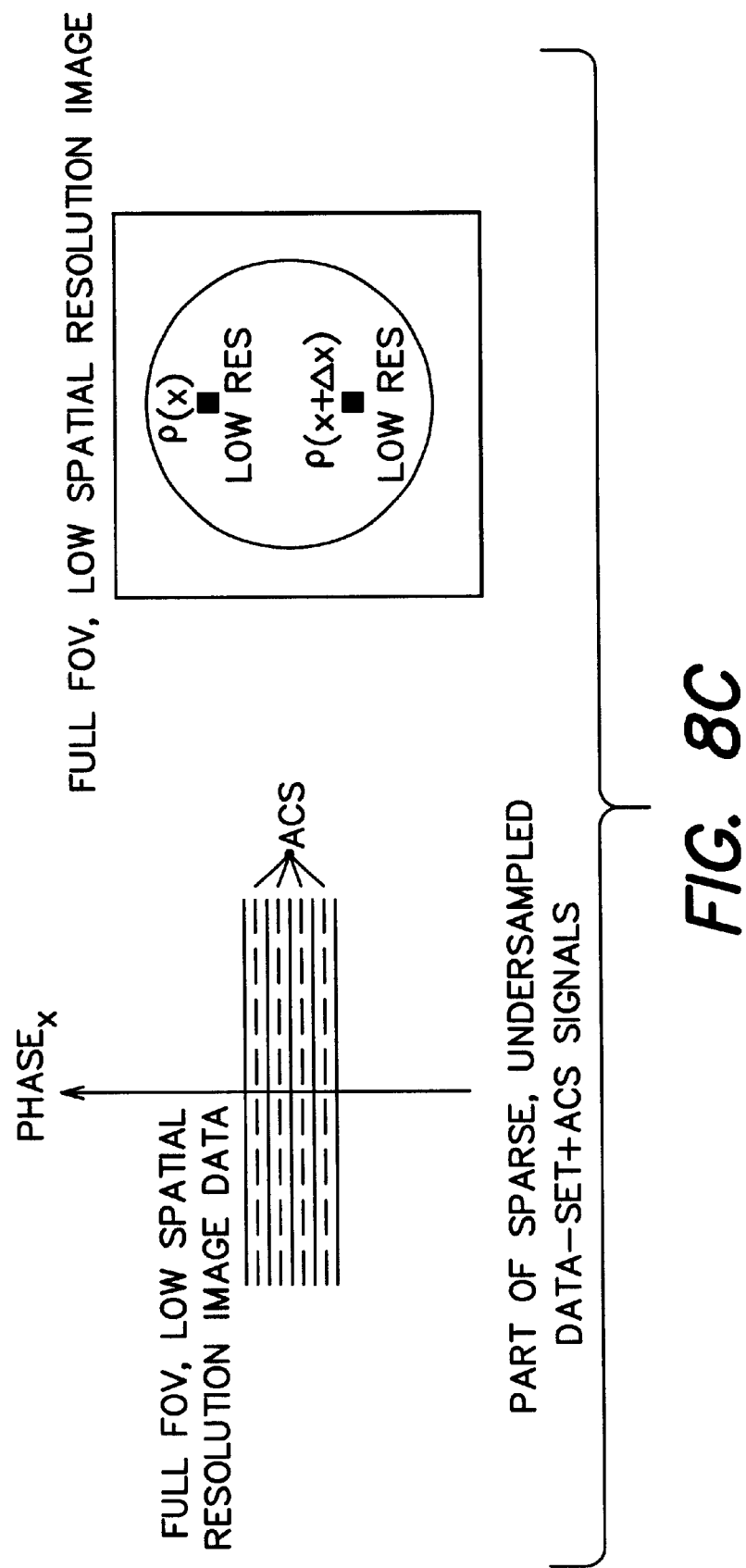

FIGS. 8A–8E illustrate this operation. FIG. 8A and 8B illustrate the prior art approach described above wherein an undersampled data set (FIG. 8B, left side) is acquired and transformed into a folded image (FIG. 8B, right side), and wherein a full-encoded data set is also acquired (FIG. 8A, left side) and used to form a full FOV high resolution reference image (FIG. 8A, right side). The reference image is then used to determine the correct pixel values and correct the aliased image formed from the multi-coil but undersampled data. Applicant's autocalibration approach relies upon the realization that coil sensitivity is a slowly-changing function, and will generally be faithfully reflected in the pixel values of a low resolution image. Applicant's method as applied to such a subencoding technique proceeds as shown in FIG. 8C, by acquiring additional ACS lines in the central region of k-space, sufficient to form a full FOV but low resolution image. The extra acquisitions may be taken between the normally acquired positions to supplement lines of the reduced set, as indicated by the dashed lines in FIG. 8C. This frequency-truncated data set is then transformed to form a full FOV, low resolution image from which the coil sensitivity related information is derived for dealiasing. By way of comparison with the conventional method of FIGS. 8A and 8B, FIG. 8D shows the set of sampled data utilized for carrying out applicants internal calibration procedure, namely the undersampled data lines of FIG. 8B augmented by the central ACS lines of FIG. 8C. This provides a significant reduction of acquisition time, and moreover allows the full FOV image for calibration to be formed first, as the partially parallel series of data is being acquired, reducing overall acquisition time.

For practicing this aspect of the invention, the ACS need not be taken between the undersampled lines of data. Applicant's invention as applied to subencoding imaging further contemplates that the additional acquisition of lines in the center of k-space may be data lines extending across the sparse or undersampled data set, as indicated in FIG. 8E. These lines are then transformed, e.g., with a two dimensional Fourier or other imaging transformation, to form a low resolution but full FOV calibration image. In FIG. 8E, the normally collected set of subencoded lines are shown as solid lines, and the frequency limited ACS lines acquired for forming the low resolution calibration image are shown as dashed lines extending across the sparse data set. This calibration procedure with a low resolution image formed from data lines extending across the sparse data set, is expected to further improve resolution in one direction.

Figure 9:
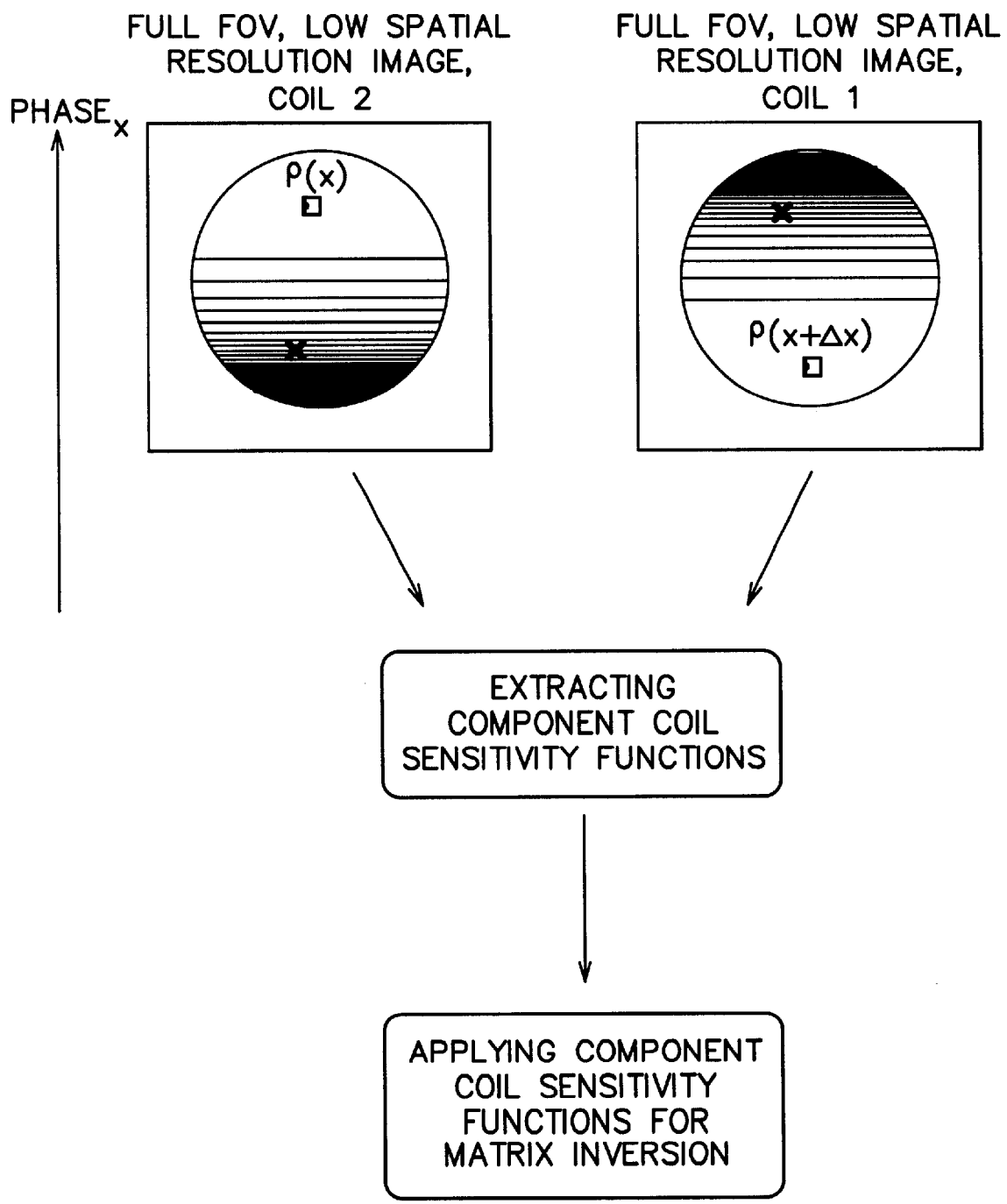
FIG. 9 illustrates dealiasing in the embodiment of FIGS. 8A–8E.

FIG. 9 further illustrates in generality the steps of the method as applied to such a subencoding PPA imaging process. As shown, each coil produces a low spatial resolution image. The coil sensitivity related functions are extracted and used for matrix inversion to dealias the images. Again, the acquired central k-space lines can be used for the final image reconstruction. In that sense the additional acquired signals serve as internal calibration signals, or ACS in a similar way as described for AUTO-SMASH.

It is further contemplated that the set of frequency-limited ACS lines acquired for forming a low resolution calibration image may itself be acquired by the first ACS technique described above—that is, by determining a signal transformation to map each multi-coil MR response into plural distinct offset lines of the k-space or other data matrix. Thus, while the acquisition of, say, sixteen central lines does not generally require a lengthy time,even this acquisition may be accelerated by the AUTO-SMASH signal transformation of the present invention. This strategy for forming low resolution images may be especially useful in conjunction with a simplified procedure for programming the control of implementation of the imaging steps, for example by a plug-in coil array which carries out the necessary signal transformation and simply provides a signal output with multiple lines of directly-usable MR response signal data.

As noted above, autocalibration can also be achieved with a single ACS signal which is acquired after switching read-out and phase-encoding direction. A full FOV MR auto-calibration signal is then acquired containing information about the SRF and the aliasing effects in the component coils. This additional information is then applied to reconstruct the undersampled MR data set. The ACS signal can be acquired in a projective fashion or in combination with a spatial selection technique applied prior to ACS acquisition so that the ACS signal is collected only from certain regions of the image volume.

Figure 10:
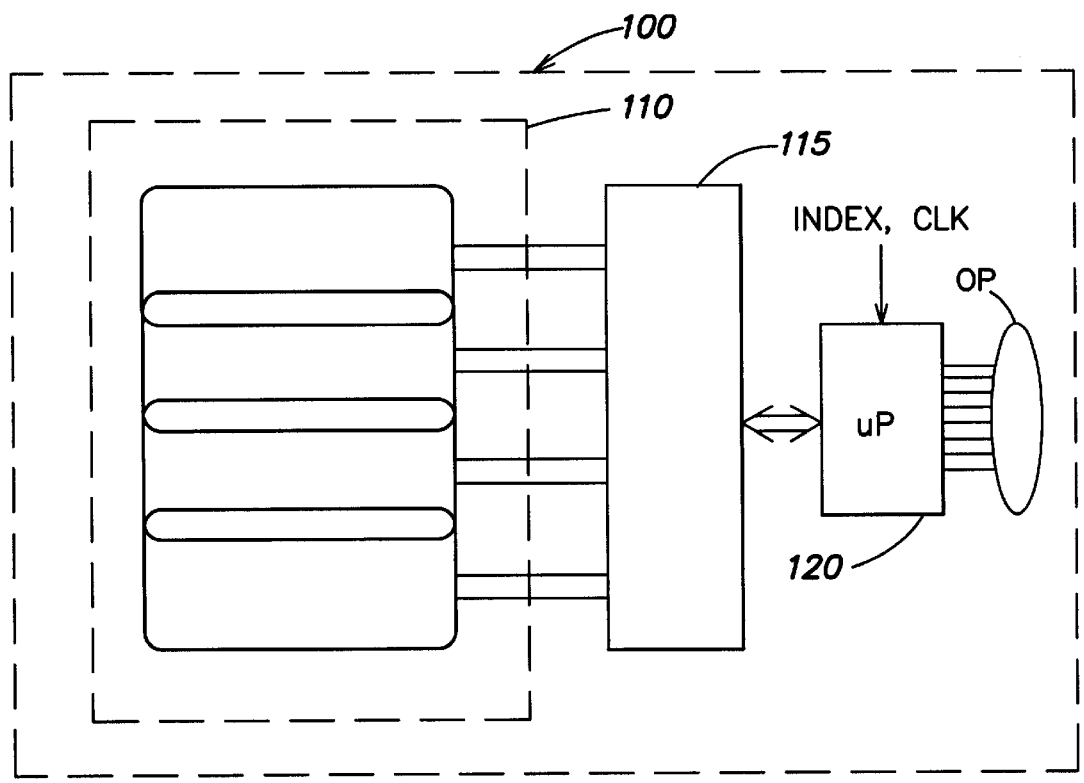
FIG. 10 illustrates a dedicated autocalibrating coil assembly of the invention.

In the foregoing embodiments, a simple fitting procedure fits the received coil signals to ACS signals received with a defined but different encoding step to determine a transformation mapping the signals simultaneously received in L coils to M distinct lines of the signal data set. The invention further contemplates a construction wherein this processing is performed in a customized coil assembly, packaged as an integrated hardware unit that includes the set of coils and a processor which performs the fitting transform and operates on the coil signals to produce M separate output signals having the required spatial separation. FIG. 10 illustrates such a coil assembly.

The AUTO-SMASH imaging described herein is particularly suited to hardware implementations of the coil assembly to upgrade or extend the imaging of existing MRI apparatus. FIG. 10 illustrates such a dedicated AUTO-SMASH coil assembly 100. In its basic aspects, the unit 100 includes a set of coils $C_1, C_2, \ldots C_n$ arranged in unit 110 covering a region, and includes a signal conditioner 115 as well as a microprocessor 120. The signal conditioner includes, for example, basic signal conditioning and digitizing circuitry to provide coil output signals in a format for manipulation by the microprocessor. The microprocessor, in turn, is configured to perform the above-described procedure of fitting coil signals to the corresponding signals acquired in an ACS conditioning step, and thereafter, transforming the signals received by the coils to provide M distinct lines of data signals for each conditioning step at its output port OP. In a basic embodiment, the microprocessor may receive basic timing and indexing or control data inputs from the main control processor indicating the applied spin conditioning, and then proceed to acquire ACS coil signals, acquire the next identified set of responses and determine the transformations for mapping each measured line to one or more distinct lines. It then forms the transformed signals, which are sent as multiple lines of synthetic signal data to its output port. Such a dedicated coil array need not operate entirely in the digital domain, and in other embodiments, the microprocessor may operate to interconnect an appropriate set of analog circuit elements to operate directly on the coil signals with appropriate analog operations and produce the required transformed output signals.

The invention being thus disclosed and representative embodiments and applications described, further variations and modifications will occur to those skilled in the art, and all such variations and modifications are considered to be within the scope of the invention and its equivalents, as set forth in the claims appended hereto.

What is claimed is:

1. A method of magnetic resonance imaging of a continuous region of a body by conditioning nuclear spins and measuring RF signals indicative of the conditioned spins, by performing multiple steps of spatially conditioning spins in the region and collecting MR response signals from the region in plural receiving coils, and performing a spatial transformation of an ordered data set to produce a magnetic resonance image of said region, wherein the method includes the steps of performing a sparse set of spin conditioning steps and collecting corresponding measured MR response signals in said plural receiving coils forming a sparse data set performing at least one additional spin conditioning step distinct from said sparse set of spin conditioning steps and collecting calibration MR response signals in said plural receiving coils fitting said measured MR response signals to said calibration MR response signals to determine a transformation, and applying said transformation to the measured MR response signals to fill additional lines of the data set thereby forming a data set of enhanced image content using said sparse set of spin conditioning steps.

2. The method of claim 1, wherein the sparse set of spin conditioning steps produces a reduced set of lines corresponding to an aliased image, and the step of performing at least one additional spin conditioning step is applied to acquire lines of the data set below a cutoff frequency thereby acquiring central lines corresponding to a full FOV low resolution image, and further comprising the step of determining coil sensitivity related information from said image.

3. The method of claim 1, wherein the step of performing at least one spin conditioning step and collecting signals is performed by applying gradients and acquiring calibration signals in a central region of k-space.

4. The method of claim 1, wherein the step of performing at least one spin conditioning step and collecting signals is performed by conditioning spins to acquire calibration signals which extend across the sparse data set.

5. The method of claim 1, wherein the step of performing at least one spin conditioning step and collecting calibration signals is performed to acquire calibration information in an area of non-uniform spin density.

6. The method of claim 1, wherein the step of performing at least one spin conditioning step and collecting calibration signals is performed to acquire coil sensitivity related reconstruction information in an area of non-uniform spin density.

7. The method of claim 1, wherein the step of performing at least one spin conditioning step and collecting calibration signals is performed multiple times to acquire coil sensitivity related reconstruction information.

8. The method of claim 1, wherein the step of performing at least one spin conditioning step and collecting calibration signals is performed at one or more times selected from among a set of times which are before, during, or after performing said sparse set of spin conditioning steps.

9. The method of claim 1, wherein the calibration signals are included as lines of the data set for forming said enhanced image.

10. The method of claim 1, including the step of collecting said calibration signals in a spatially selective manner.

11. The method of claim 1, wherein the step of performing additional spin conditioning and collecting said calibration signals is performed at multiple different portions of an imaging sequence to correct for one or more of magnetic relaxation, motion, flow, diffusion or related effect.

12. The method of claim 1, wherein said calibration signals are applied to non-Fourier encoding and non-Fourier reconstruction of images from signals received in the plural coils.

13. Apparatus for magnetic resonance imaging of a region of a body and including first means for conditioning nuclear spins and measuring RF signals indicative of the conditioned spins, control means for controlling the first means to perform multiple steps of spatially conditioning spins in the region and collecting MR response signals from the region in plural receiving coils, and image forming means for performing a spatial transformation of an ordered data set to produce a magnetic resonance image of said region, wherein the control means controls the first means to perform a sparse set of spin conditioning steps and collect corresponding measured MR response signals in said plural receiving coils, and also perform at least one additional spin conditioning step distinct from said sparse set of spin conditioning steps and collect calibration MR response signals in said plural receiving coils fitting said measured MR response signals to said calibration MR response signals to determine a transformation, and applying said transformation to the measured MR response signals to fill additional lines of the data set thereby forming a data set of enhanced image content for use by said image forming means.

14. A dedicated coil assembly for MR imaging comprising plural MR signal receiving coils arranged to receive MR responses from a region and produce signals indicative thereof, and a microprocessor operative on an autocalibration signal received in said coils to determine a transformation, said microprocessor applying said transformation of an MR response acquired by said plural signal receiving coils to provide a signal output comprising multiple independent signal lines and thereby more quickly fill a signal data matrix.

15. A method of magnetic resonance imaging a region of a body by conditioning nuclear spins and measuring magnetic response signals indicative of the conditioned spins, wherein the method includes performing multiple steps of spin conditioning and of collecting measurement signal responses from the region in plural receiving coils, establishing an ordered data set of collected measurement response signals, and performing a spatial transformation of the ordered data set to produce a MR image of said region, wherein the method includes the steps of performing a sparse set of spin conditioning steps and collecting a corresponding sparse data set of measured MR response signals in said plural receiving coils performing additional spin conditioning steps distinct from said sparse set of conditioning steps to sample additional low spatial frequency data forming a low resolution data set transforming said low resolution data set to a low resolution image determining coil sensitivity related information from said low resolution image, and applying said coil sensitivity related information to reconstruct an image formed from said sparse data set.

16. The magnetic resonance imaging method of claim 15, further comprising the step of applying said coil sensitivity related information to determine a transformation, and applying the transformation to said sparse data set to fill additional lines of said data set.

17. The magnetic resonance imaging method of claim 15, further comprising the step of applying said coil sensitivity related information to determine a pixel by pixel image unfolding transformation of an aliased image formed from said sparse data set.

18. The magnetic resonance imaging method of claim 15, wherein the step of performing additional spin conditioning steps is performed to acquire signals wherein the additional low frequency data extend across the sparse data set.

19. The magnetic resonance imaging method of claim 15, wherein the sensitivity related information is applied to non-Fourier encoding and non-Fourier reconstruction of images formed from signals received in the plural receiving coils.

20. Apparatus for magnetic resonance imaging a region of a body by conditioning nuclear spins and measuring magnetic response signals indicative of the conditioned spins, wherein the apparatus includes first means for performing multiple steps of spin conditioning and of collecting measurement signal responses from the region in plural receiving coils, signal processing means for establishing an ordered data set of collected measurement response signals, and image forming means for transforming the ordered data set to produce a MR image of said region, wherein the apparatus includes a controller which controls the first means to perform a sparse set of spin conditioning steps and collect a corresponding sparse data set of measured MR response signals in said plural receiving coils perform additional spin conditioning steps distinct from said sparse set of conditioning steps to sample additional low spatial frequency data forming a low resolution data set for transformation by the imaging means to a low resolution image determine coil sensitivity related information from said low resolution image, and apply said coil sensitivity related information to enhance an image formed from said sparse data set.

* * * * *